(12) United States Patent
Lee

(10) Patent No.: US 8,125,080 B2
(45) Date of Patent: Feb. 28, 2012

(54) SEMICONDUCTOR POWER MODULE PACKAGES WITH SIMPLIFIED STRUCTURE AND METHODS OF FABRICATING THE SAME

(75) Inventor: Keun-hyuk Lee, Bucheon-Gyeonggi-do (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 24 days.

(21) Appl. No.: 12/264,823

(22) Filed: Nov. 4, 2008

(65) Prior Publication Data

US 2009/0127691 A1     May 21, 2009

(30) Foreign Application Priority Data

Nov. 16, 2007 (KR) .................. 10-2007-0117361

(51) Int. Cl.
*H01L 25/16* (2006.01)
(52) U.S. Cl. ............... 257/724; 257/E25.029; 438/107
(58) Field of Classification Search .................. 257/723, 257/724, E25.029; 438/107, 108
See application file for complete search history.

(56) References Cited

U.S. PATENT DOCUMENTS

| | | | | |
|---|---|---|---|---|
| 4,639,759 A * | 1/1987 | Neidig et al. | ................. | 257/701 |
| 5,130,888 A * | 7/1992 | Moore | .......................... | 361/717 |
| 5,521,437 A * | 5/1996 | Oshima et al. | ................. | 257/701 |
| 5,576,053 A * | 11/1996 | Senda et al. | ................... | 427/123 |
| 5,703,399 A * | 12/1997 | Majumdar et al. | ............ | 257/723 |
| 6,747,875 B2 * | 6/2004 | Wildrick et al. | .............. | 361/736 |

* cited by examiner

*Primary Examiner* — N Drew Richards
*Assistant Examiner* — Daniel Shook
(74) *Attorney, Agent, or Firm* — Kilpatrick Townsend & Stockton LLP

(57) ABSTRACT

Provided are semiconductor power module packages, which are structurally simplified by bonding electrodes onto substrates, and methods of fabricating the same. An exemplary package includes a substrate and semiconductor chips disposed on a top surface of the substrate. Electrodes are bonded to the top surface of the substrate and electrically coupled to the semiconductor chips. Parts of the semiconductor chips are electrically coupled to parts of the electrodes by interconnection lines. An encapsulation unit covers the semiconductor chips, the electrodes, and the interconnection lines and exposes at least top surfaces of the electrodes.

27 Claims, 21 Drawing Sheets

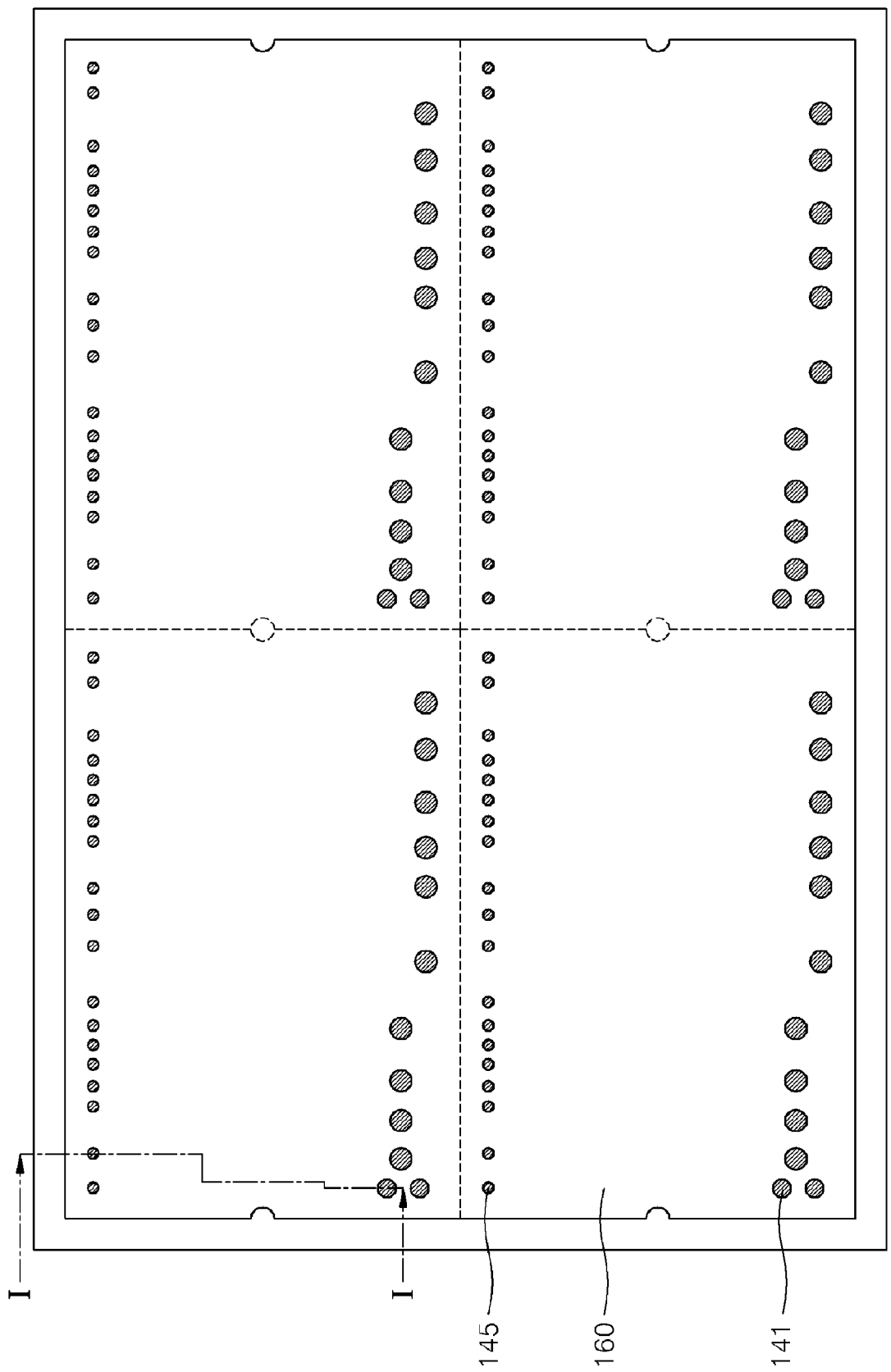

SEMICONDUCTOR POWER MODULE PACKAGES WITH SIMPLIFIED STRUCTURE AND METHODS OF FABRICATING THE SAME

CROSS-REFERENCES TO RELATED APPLICATIONS

This application claims the benefit of Korean Patent Application No. 10-2007-0117361, filed on Nov. 16, 2007, in the Korean Intellectual Property Office, the disclosure of which is incorporated herein in its entirety by reference.

BACKGROUND OF THE INVENTION

1. Field of the Invention

The present invention relates to semiconductor power modules, and more particularly, to semiconductor power module packages with simplified structures and methods of fabricating the same.

2. Description of the Related Art

A semiconductor power module package is fabricated by integrating a power semiconductor chip and a control semiconductor chip in a single package. Examples of semiconductor power devices may include silicon controlled rectifiers (SCRs), power transistors, insulated-gate bipolar transistors (IGBTs), power regulators, inverters, and converters.

In a semiconductor power module package, a semiconductor chip is bonded onto a lead frame and encapsulated using an encapsulant. With an increase in the integration density of semiconductor chips, the number of bonding pads required for connecting the semiconductor power module package with external devices also increases. Thus, the number of leads of the lead frame and the dimension of semiconductor packages are also increased. However, since electronic devices are showing a tendency to be downscaled, miniaturization of not only the semiconductor chips but also the semiconductor packages has been required more and more.

BRIEF SUMMARY OF THE INVENTION

Aspects of the present invention provide semiconductor die packages, semiconductor power module packages, and the like, which are structurally simplified by attaching electrodes onto substrates, and methods of fabricating the same.

According to an aspect of the present invention, there is provided an exemplary semiconductor power module package including a substrate and semiconductor chips disposed on a top surface of the substrate. Electrodes are attached to the top surface of the substrate and electrically coupled to the semiconductor chips. A semiconductor chip may be electrically coupled to one or more electrodes by one or more interconnection lines. An encapsulation unit covers the semiconductor chips, the electrodes, and the one or more interconnection lines and exposes at least top surfaces of the one or more electrodes.

The interconnection lines may comprise conductive lines, such as gold (Au) lines or aluminium (Al) lines, or wires. The semiconductor chips may include power semiconductor chips and/or control semiconductor chips, and the electrodes may include power electrodes and/or signal electrodes. The power semiconductor chips may be electrically coupled to the power electrodes through the interconnection lines, and the control semiconductor chips may be electrically coupled to the signal electrodes. The electrodes may comprise Sn-plated electrodes or NiAu-plated Au electrodes. Also, the electrodes may comprise I-shaped pillar structures or inverted T-shaped structures.

According to another aspect of the present invention, there is provided an exemplary method of fabricating a semiconductor power module package. A plurality of semiconductor chips and a plurality of electrodes are mounted on each of a plurality of unit substrates. The unit substrates are part of a mother substrate, and may be arranged in a matrix on the mother substrate. The semiconductor chips and the electrodes mounted on each unit substrate are electrically interconnected using a bonding process. An encapsulation unit is formed on the mother substrate to cover the semiconductor chips and the electrodes and expose the at least top surfaces of the electrodes. Thereafter, the mother substrate is sawed into individual semiconductor power module packages.

BRIEF DESCRIPTION OF THE DRAWINGS

The above and other features and advantages of the present invention will become more apparent by describing in detail exemplary embodiments thereof with reference to the attached drawings in which:

FIGS. 4A through 4F are plan views illustrating a method of fabricating a semiconductor power module package according to an embodiment of the present invention;

DETAILED DESCRIPTION OF THE INVENTION

Figure 1A:
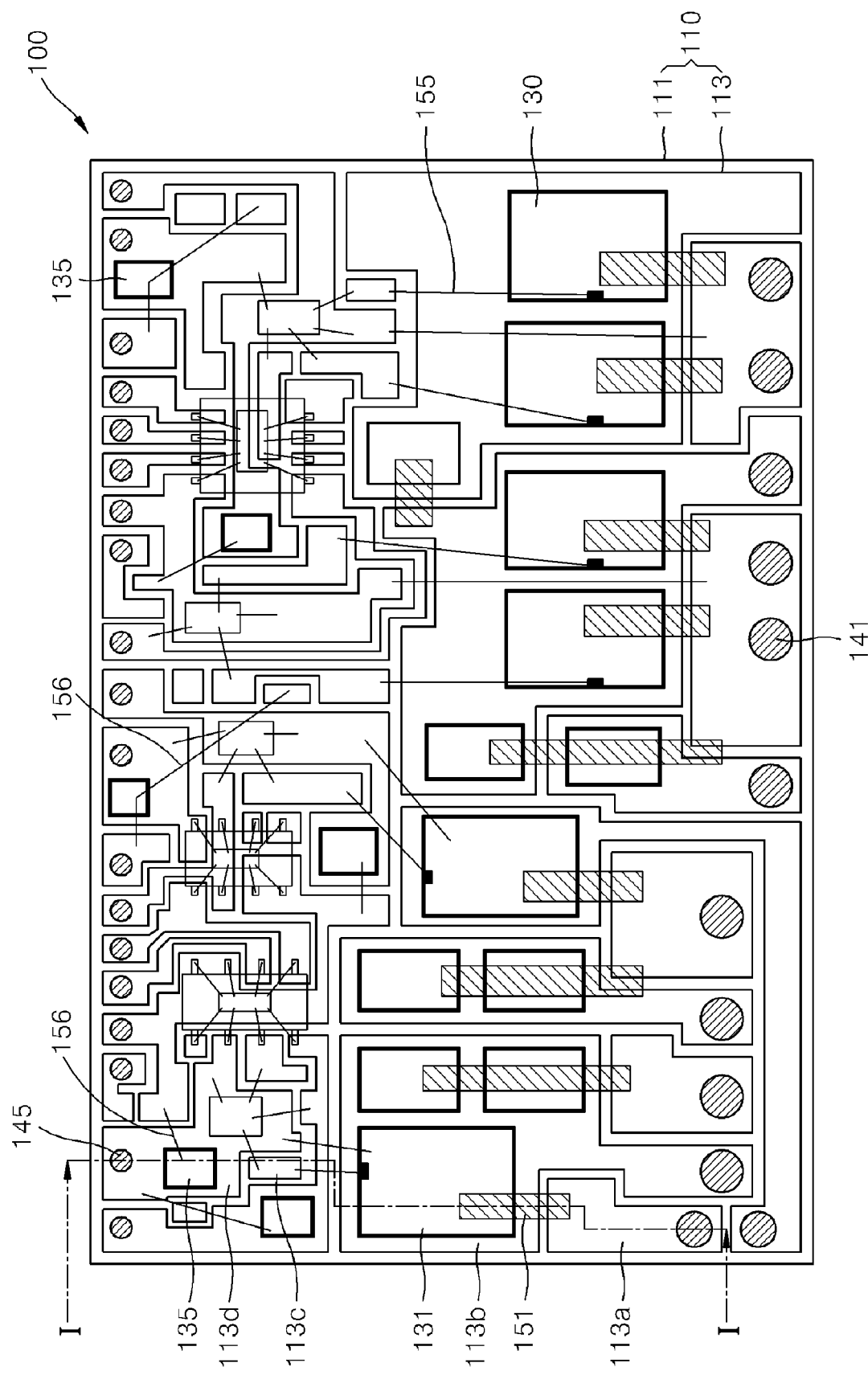
FIG. 1A is a plan view of a semiconductor power module package according to an embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions are exaggerated for clarity. The same reference numerals are used to denote the same elements throughout the specification.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an above and below orientation.

Figure 1B:
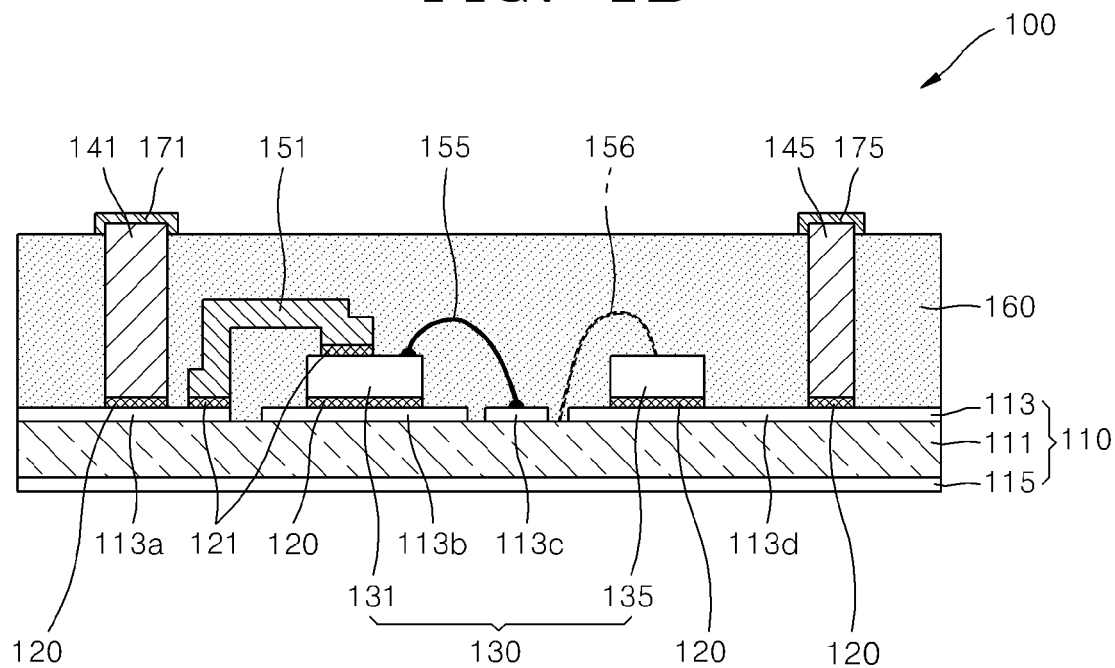
FIG. 1B is a cross-sectional view taken along a line I-I of FIG. 1, according to an embodiment of the present invention.
Figure 1C:
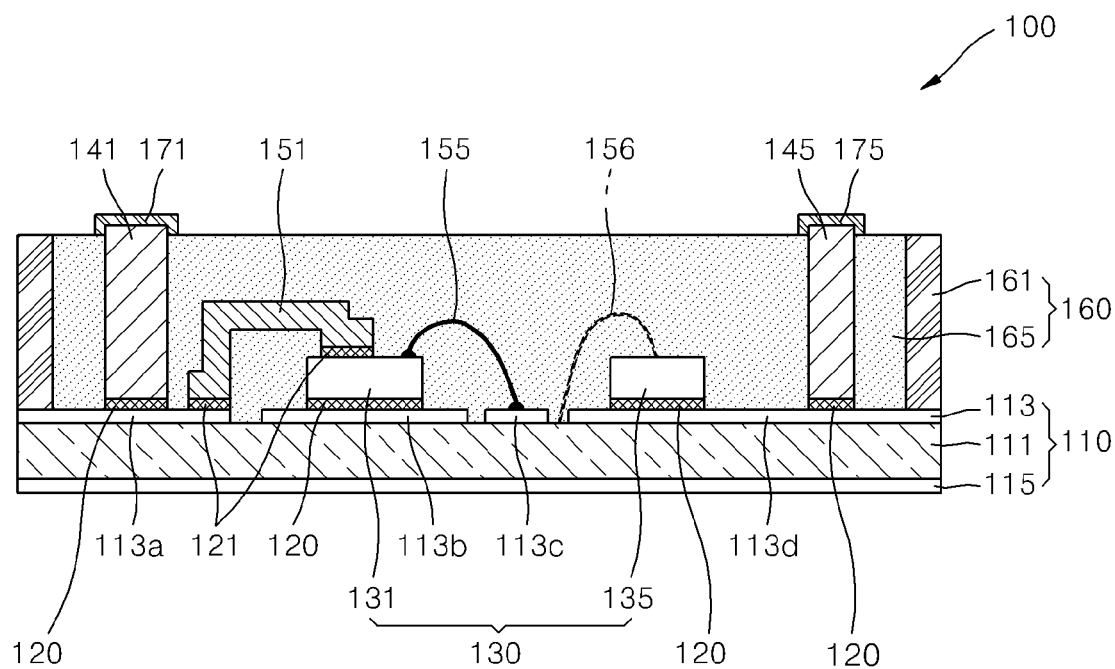
FIG. 1C is a cross-sectional view taken along the line I-I of FIG. 1, according to another embodiment of the present invention.

FIG. 1A is a plan view of a semiconductor power module package 100 according to an embodiment of the present invention, FIG. 1B is a cross-sectional view taken along a line I-I of FIG. 1, according to an embodiment of the present invention, and FIG. 1C is another cross-sectional view taken along the line I-I of FIG. 1, according to an embodiment of the present invention.

Referring to FIGS. 1A through 1C, the semiconductor power module package 100 includes a substrate 110. The substrate 110 may comprise a direct bonding copper (DBC) substrate. The substrate 110 may include an insulating layer 111, an upper conductive layer 113 disposed on a top surface of the insulating layer 111, and a lower conductive layer 115 disposed on a bottom surface of the insulating layer 111. The insulating layer 111 may comprise one or more ceramic materials, and may include such materials as $Al_2O_3$, AlN, $SiO_2$, and/or BeO. Each of the upper and lower conductive layers 113 and 115 may comprise copper (Cu). The upper conductive layer 113 may include conductive layer patterns 113a, 113b, 113c, and 113d that are electrically insulated from one another. The conductive layer patterns 113a-113d provide electrically conductive regions disposed on the substrate, and will be referred to herein as conductive regions 113a-113d.

The substrate 110 may also comprise an insulated metal substrate (IMS). The IMS may include an aluminum (Al) substrate, an insulating layer disposed on the Al substrate, and a conductive layer disposed on the insulating layer, with the conductive layer having patterned conductive regions. In this case, the insulating layer may comprise a polymer, and the conductive layer may comprise copper. Also, the substrate 110 may comprise a printed circuit board (PCB) having a conductive layer with patterned conductive regions.

Semiconductor chips 130 are disposed on the substrate 110. Among the semiconductor chips 130, first semiconductor chips 131 may be power semiconductor chips, and second semiconductor chips 135 may be control semiconductor chips. A typical power semiconductor chip comprises one or more power-handling devices (such as FETs, IGBTs, SCRs, diodes, power regulators, inverters, and converters, etc.), has one or two electrical terminals on its top surface, and oftentimes has one electrical terminal on its back surface (such as when it comprises a vertical power device). A typical control semiconductor chip may comprise logic gates and driver circuitry for generating control signals for controlling the power-handling devices, and may have a small number of electrical terminals on its top surface. A control semiconductor chip typically has a ground terminal on its back surface, while some control semiconductor chips have only backside metallizations for solder bonding to a substrate. Solder pads 120 are disposed on portions of conductive regions 113a, 113b, and 113d. The solder pads 120 may comprise any of the material groups Pb/Sn, Sn/Ag, Pb/Sn/Ag, or Sn/Ag/Cu, or other material groups known to the art. The semiconductor chips 131 and 135 are attached to corresponding ones of these solder pads 120 at their back surfaces. Conventional die placement equipment may be used to place the chips on the solder pads. In various implementations, the control semiconductor chips (e.g., chips 135) may be flip-chip bonded to conductive regions of the substrate.

Electrodes 141 and 145 for electrically coupling the semiconductor chips 130 with external devices are disposed on selected ones of the solder pads 120. In the exemplary embodiment shown in FIGS. 1A-1C, electrodes 141 and 145 are disposed on the solder pads 120 that are located on the conductive regions 113a and 113d. First electrodes 141 may be power electrodes for transferring the power between the first semiconductor chips 131 and the external devices, while second electrodes 145 may be signal electrodes through which the second semiconductor chips 135 receive/transmit signals from/to the external devices. The first electrodes 141 may be disposed adjacent to the first semiconductor chips 131 that are functioning as the power semiconductor chips, while the second electrodes 145 may be disposed adjacent to the second semiconductor chips 135 that are functioning as the control semiconductor chips. The sizes of the first and second electrodes 141 and 145 may be determined according to current levels. The first electrodes 141 may have higher current levels than the second electrodes 145, and thus may have larger sizes than the second electrodes 145.

The first semiconductor chips 131 may be electrically coupled to corresponding ones of the first electrodes 141 by way of corresponding first interconnection lines 151. As an example, a first interconnect line 151 may have a first end disposed over a portion of the top surface of a first semiconductor chip 131 and electrically coupled thereto by a body 121 of solder, and a second end disposed over a portion of conductive region 113a and electrical coupled thereby by another body 121 of solder. As described above, first electrode 141 is also electrically coupled to conductive region 113a, thereby completing an electrically current path between electrode 141 and semiconductor chip 131. The first interconnection lines 151 may be conductive lines with a predetermined width. The first interconnection lines 151 may comprise Al lines or Au lines. The first semiconductor chips 131 may be electrically coupled to the conductive regions 113c, which are different from the conductive regions 113a on which the first semiconductor chips 131 are disposed, through first wires 155. First wires 155 may comprise wire bonds, ribbon bonds, and the like. A first electrode 141 (e.g., power electrode) or a second electrode 145 (e.g., signal electrode) may be electrically coupled to conductive regions 113a, and/or another chip may be electrically coupled to conductive region 113a.

First portions of the second semiconductor chips 135 are electrically coupled to a corresponding ones of the second electrodes 145 by way of corresponding conductive regions 113d, upon which the chips 135 and electrodes 145 are disposed. The second semiconductor chips 135 and the second electrodes 145 are attached to conductive regions 113d by the solder pads 120, which are disposed on the same conductive regions 113d. Second portions of the second semiconductor chips 135 may be electrically coupled to the conductive regions 113a, 113b, and 113c, which are different from the conductive region 113d on which the second portions of the second semiconductor chips 135 are disposed, through second wires 156. Second wires 156 may comprise wire bonds, ribbon bonds, and the like.

An encapsulation unit 160 is disposed on the substrate 110 to expose at least the top surfaces of the first and second electrodes 141 and 145, and to cover the semiconductor chips 130, the first and second electrodes 141 and 145, the first interconnection lines 151, and the first and second wires 155 and 156. The encapsulation unit 160 may be formed so as to expose only the top surfaces of the first and second electrodes 141 and 145, or to expose a top surface and portions of side surfaces of the first and second electrodes 141 and 145.

In some implementations, the encapsulation unit 160 may be integrally formed on the substrate 110 as shown in FIG. 1B. In other implementations, the encapsulation unit 160 may comprise a wall portion 161 and a main portion 165 as shown in FIG. 1C. The wall portion 161 may be formed along one or more edges of the substrate 110 (e.g., formed along the periphery of the substrate). The main portion 165 is disposed adjacent to the wall portion 161 and over at least a portion of the substrate, and covers the semiconductor chips 130, the first and second wires 155 and 156, the first interconnection lines 151 and the first and second electrodes 141 and 145 except for at least the top surfaces of the first and second electrodes 141 and 145. The encapsulation unit 160 may be formed of epoxy molding compound (EMC). Plated layers 171 and 175 may be further formed on exposed portions of the first and second electrodes 141 and 145. The plated layers 171 and 175 may comprise solder plated layers. The encapsulation unit 160 may be formed to expose the lower conductive layer 115 of the substrate 110. A heat sink may be adhered to the exposed lower conductive layer 115 of the substrate 110 in order to dissipate heat emitted by the semiconductor chips 130.

Figure 2A:
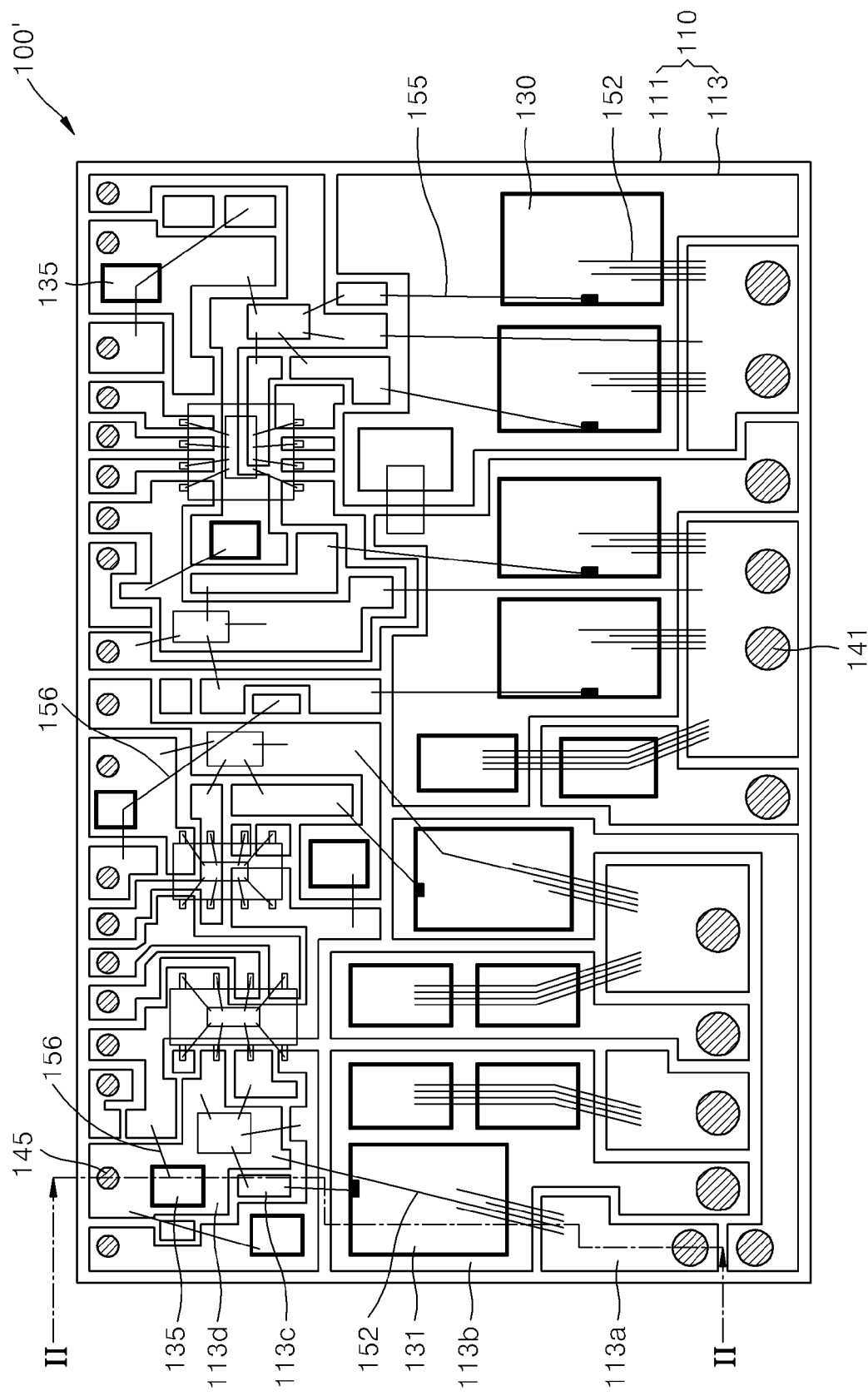
FIG. 2A is a plan view of a semiconductor power module package according to another embodiment of the present invention.
Figure 2B:
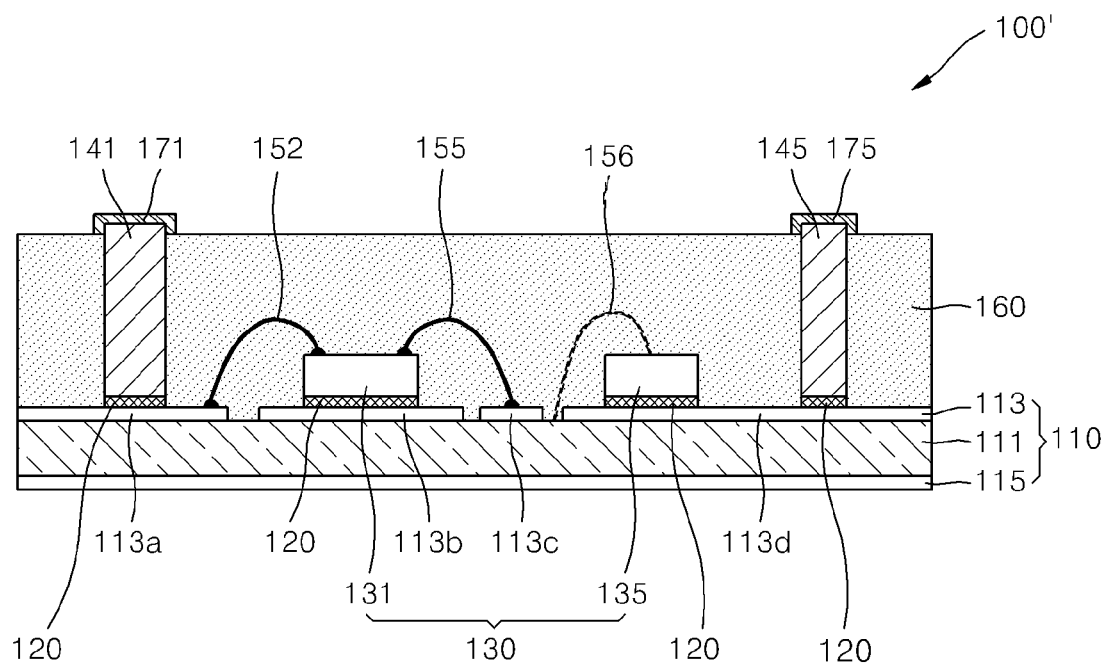
FIG. 2B is a cross-sectional view taken along a line II-II of FIG. 2, according to an embodiment of the present invention.
Figure 2C:
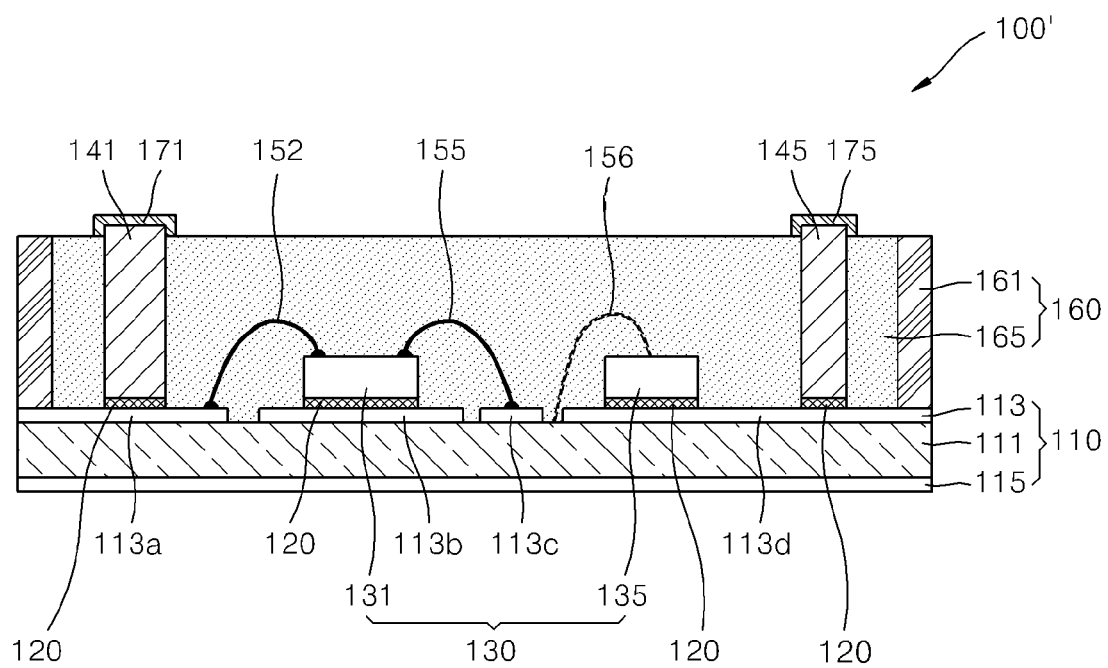
FIG. 2C is a cross-sectional view taken along the line II-II of FIG. 2, according to another embodiment of the present invention.

FIG. 2A is a plan view of a semiconductor power module package 100' according to another embodiment of the present invention, FIG. 2B is a cross-sectional view taken along a line II-II of FIG. 2, and FIG. 2C is another cross-sectional view taken along the line II-II of FIG. 2, according to another embodiment of the present invention.

Referring to FIGS. 2A through 2C, the semiconductor power module package 100' according to the present embodiment is generally the same as the semiconductor power module package 100 shown in FIGS. 1A through 1C except for a connection structure between the first semiconductor chip 131 and the first electrode 141. Specifically, in the semiconductor power module package 100' shown in FIGS. 2A through 2C, the first semiconductor chips 131 are electrically coupled to the first electrodes 141 through second interconnection lines 152. The second interconnection lines 152 may comprise a plurality of wires. Thus, the conductive regions 113a may be wire-bonded to the first semiconductor chips 131 using the second interconnection lines 152. Second interconnect lines 152 may comprise wire bonds, ribbon bonds, and the like.

Figure 3:
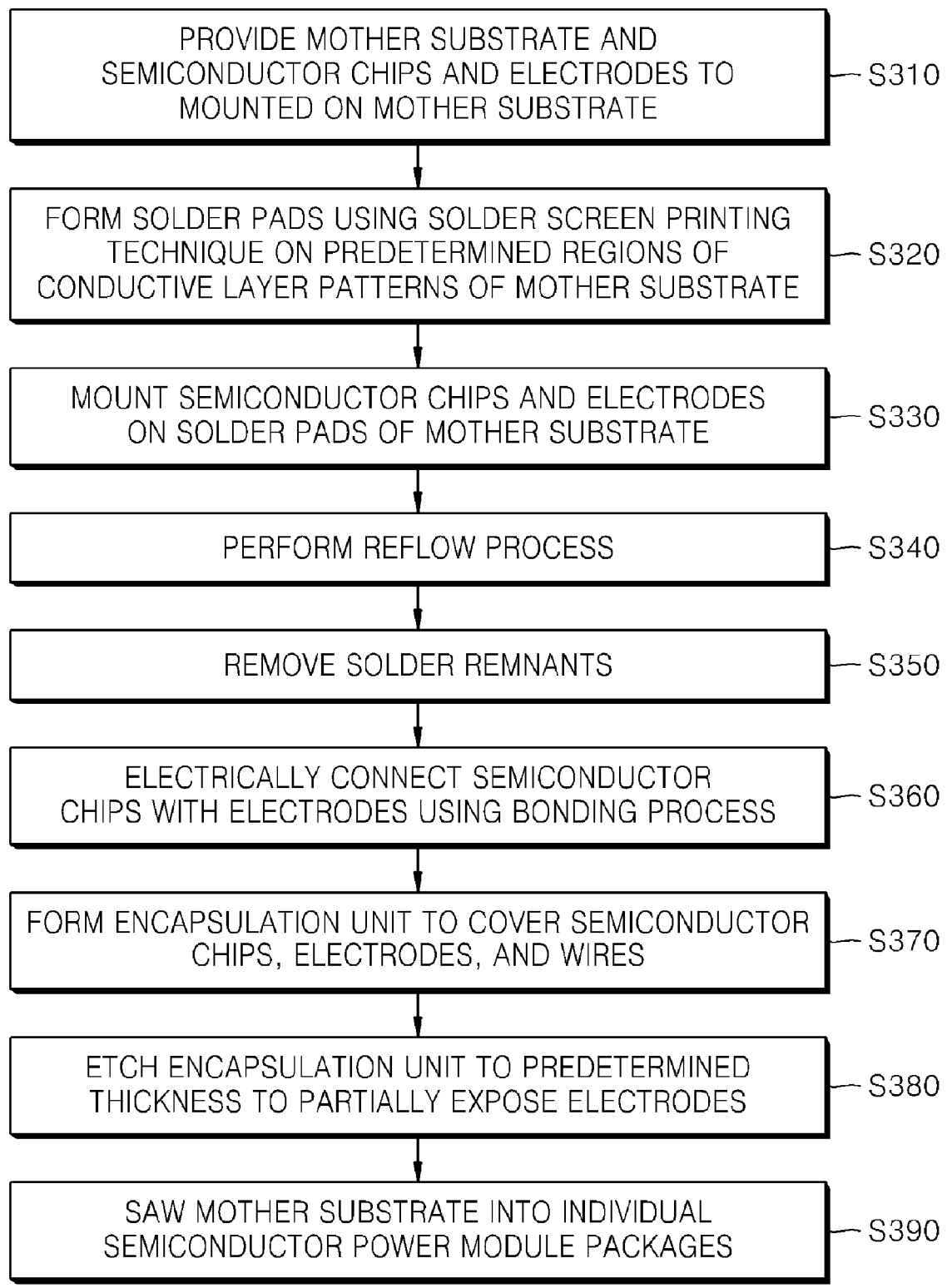
FIG. 3 is a flowchart of a method of fabricating a semiconductor power module package according to an embodiment of the present invention.

FIG. 3 is a flowchart of an exemplary method of fabricating a semiconductor power module package according to an embodiment of the present invention, FIGS. 4A through 4F are plan views illustrating the exemplary method of fabricating a semiconductor power module package according to an embodiment of the present invention, and FIGS. 5A through 5F are cross-sectional views taken along lines I-I of FIGS. 4A through 4F, respectively.

Figure 4A:
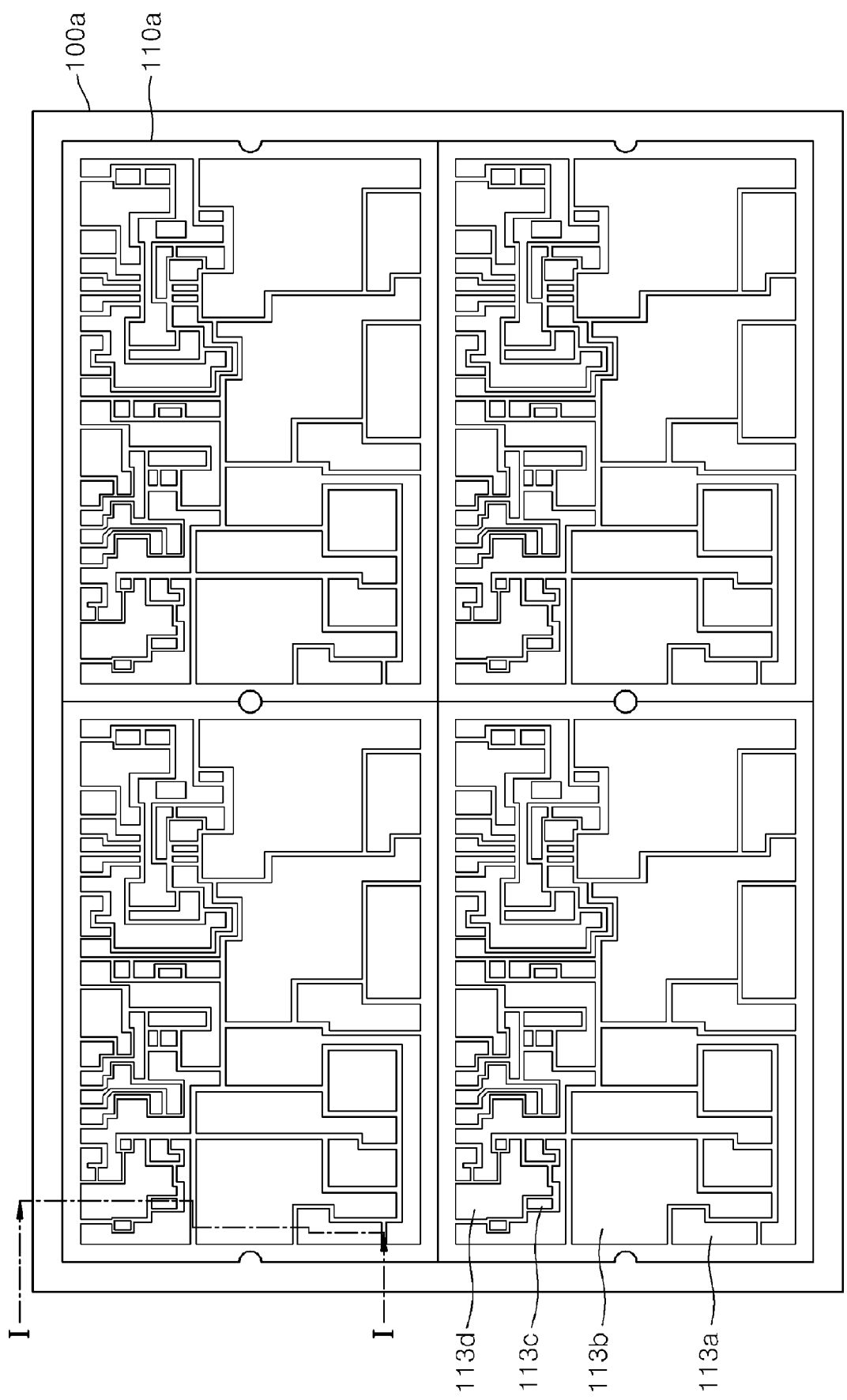
Figure 5A:
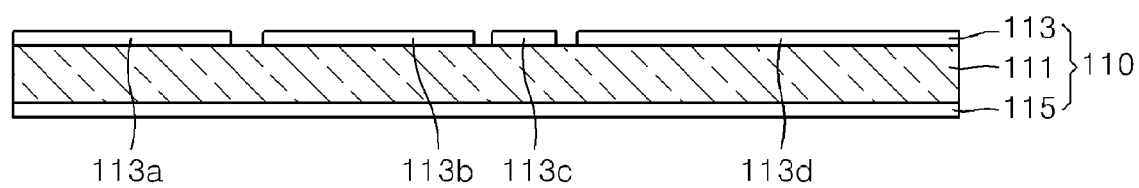
FIGS. 5A through 5F are cross-sectional views taken along lines I-I of FIGS. 4A through 4F, respectively.

Referring to FIGS. 3, 4A, and 5A, a mother substrate 100a and components to be mounted on the mother substrate 100a are obtained or provided in operation S310. The mother substrate 100a may be obtained by making it using known substrate formation processes (operations), or by receiving it from an external source (e.g., outside vendor), which may manufacture it according to a desired specification. The mother substrate 100a preferably includes an m×n number of unit substrates 110a, for example, 2×2 unit substrates 110a, preferably arranged in a matrix. Here, one of m and n is an integer equal to or more than 2, the other is an integer equal to or more than 1. During a subsequent sawing process, the mother substrate 100a is separated into the unit substrates 110a each of which corresponds to the substrate 110 of the semiconductor power module package 100 shown in FIG. 1A. Each of the unit substrates 110a may include a ceramic insulating layer 111 and upper and lower conductive layers 113 and 115 disposed on top and bottom surfaces, respectively, of the ceramic insulating layer 111. The upper conductive layer 113 may include a plurality of conductive regions 113a, 113b, 113c, and 113d. For example, the upper and lower conductive layers 113 and 115 may be thermally pressed to the ceramic insulating layer 111. A component may include a first or second semiconductor chip (refer to 131 and 135 in FIG. 1A), or a first or second electrode (refer to 141 and 145 in FIG. 1A). Also, a component may include a passive device, such as a resistor or a capacitor.

Figure 6:
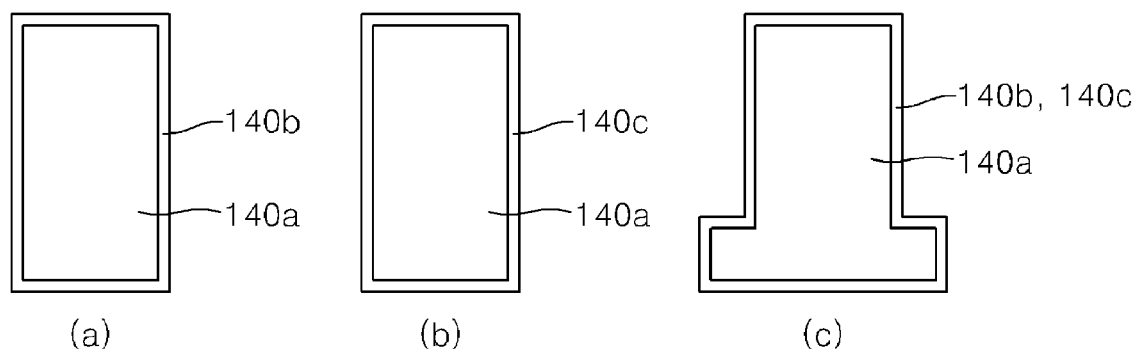
FIGS. 6($a$) through 6($c$) are cross-sectional views of electrodes of a semiconductor power module package according to embodiments of the present invention.

Each of the first and second electrodes 141 and 145 may have an I-shaped pillar structure shown in FIGS. 6(a) and 6(b), or may have an inverted T-shaped structure shown in FIG. 6(c), which can be easily mounted on the substrate 110. Each of the first and second electrodes 141 and 145 may comprise an electrode 140a plated with a NiAu layer 140b as shown in FIG. 6(a) or an electrode 140a plated with a Sn layer 140c as shown in FIG. 6(b).

Figure 4B:
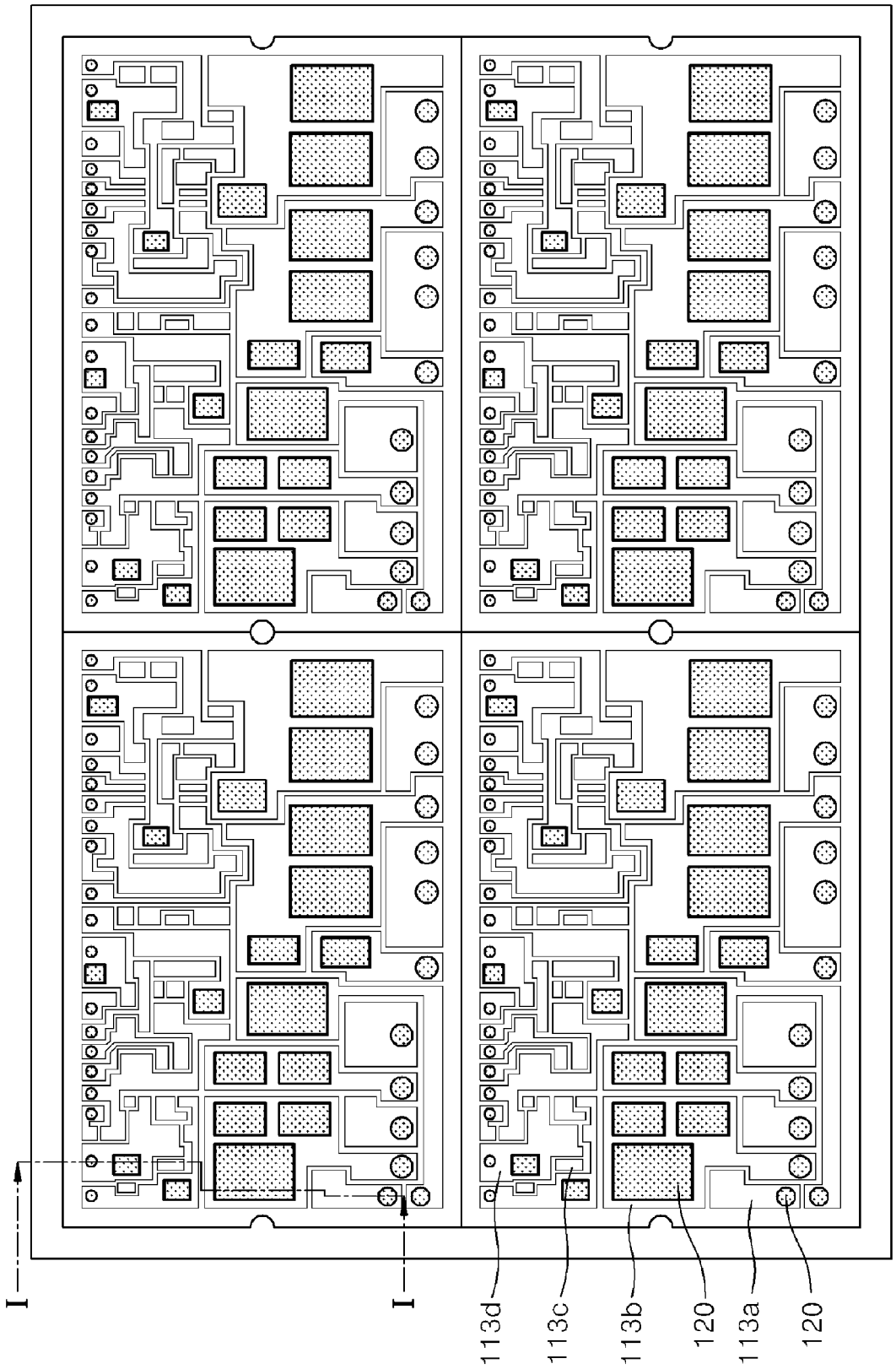
Figure 5B:
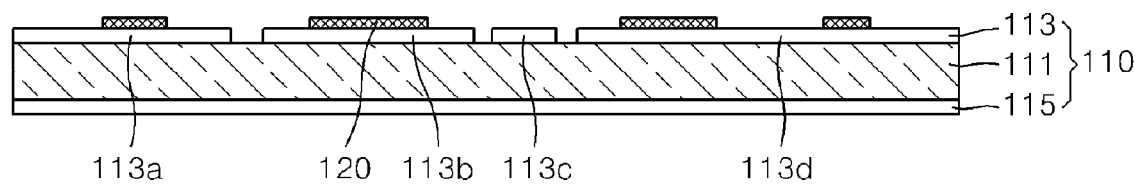

Referring to FIGS. 3, 4B, and 5B, in operation S320, solder pads 120 are formed on top surfaces of the conductive regions 113a, 113b, and 113d on which the first and second semiconductor chips 131 and 135 and the first and second electrodes 141 and 145 will be disposed. The solder pads 120 are preferably selectively formed only on the regions of the top surfaces of the conductive regions 113a, 113b, and 113d where the first and second semiconductor chips 131 and 135 and the first and second electrodes 141 and 145 will be disposed. The solder pads 120 may be formed by screen printing or other known solder deposition techniques.

Figure 4C:
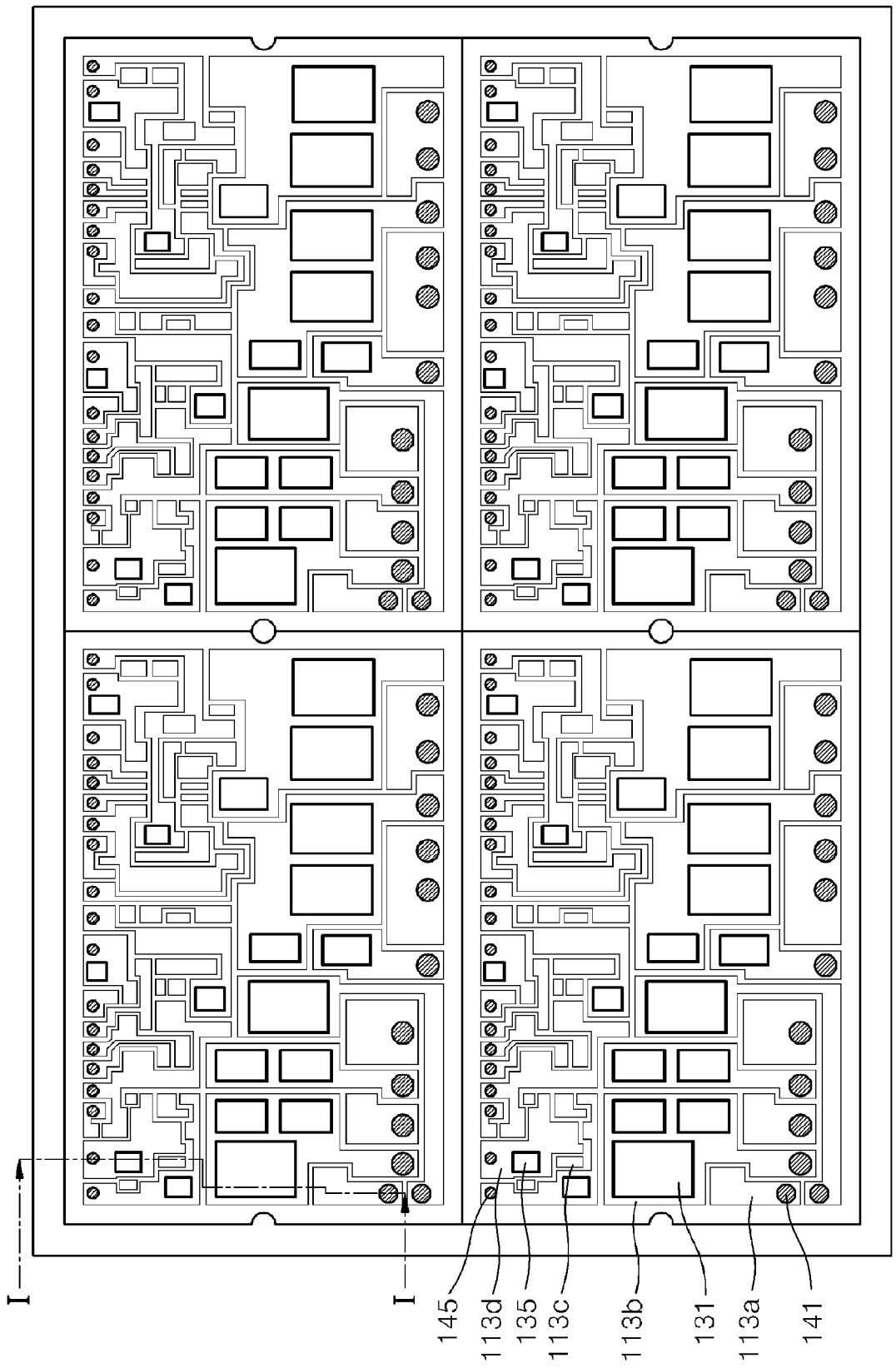
Figure 5C:
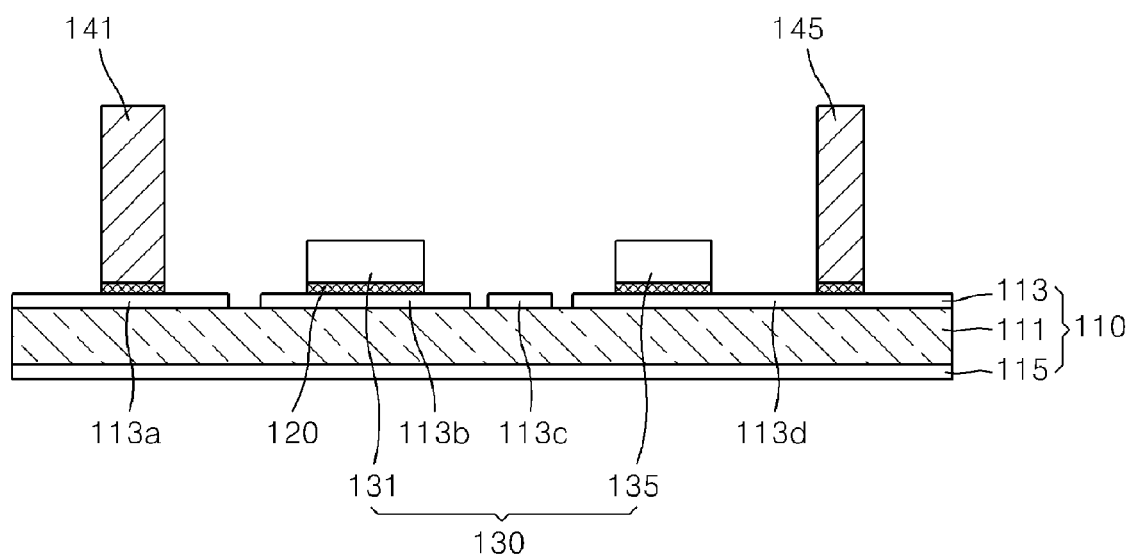

Referring to FIGS. 3, 4C, and 5C, in operation S330, the first and second semiconductor chips 131 and 135 and the first and second electrodes 141 and 145 are placed onto the solder pads 120 using an auto component mounter (not shown), so that the first and second semiconductor chips 131 and 135 and the first and second electrodes 141 and 145 are mounted on the conductive regions 113a, 113b, and 113d. In operation S340, the solder pads 120 are reflowed by a reflow process so that the first and second semiconductor chips 131 and 135 and the first and second electrodes 141 and 145 are attached and electrically coupled to the conductive regions 113a, 113b, and 113d. The reflow process also substantially increases the thermal coupling of the semiconductor chips to the regions and the unit substrates. Pressure may be applied to the components during the reflow process to press them against the conductive regions (e.g., a thermally-pressed reflow process). In operation S350, solder remnants are removed from the mother substrate 110 using a cleaning process.

Figure 4D:
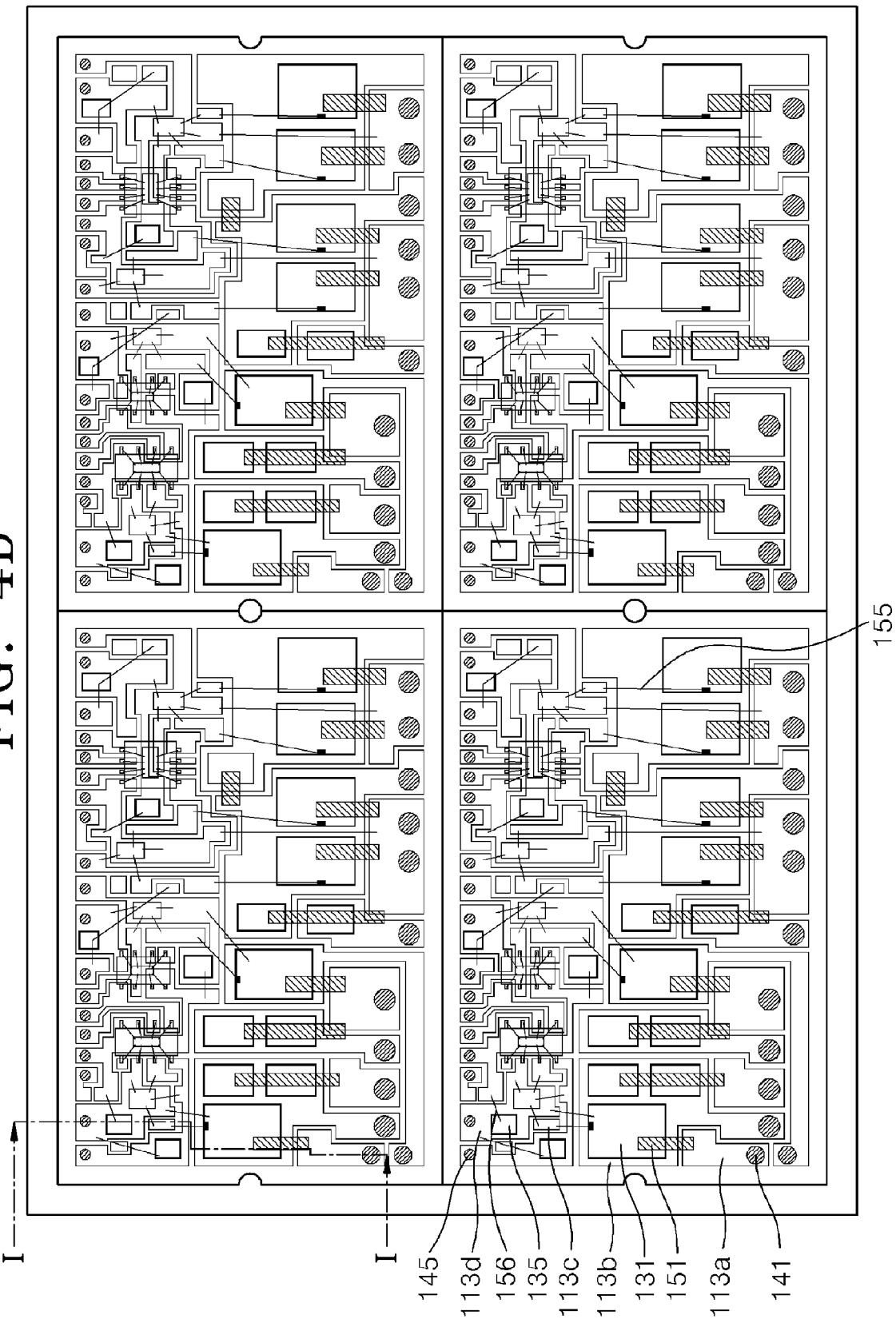
Figure 5D:
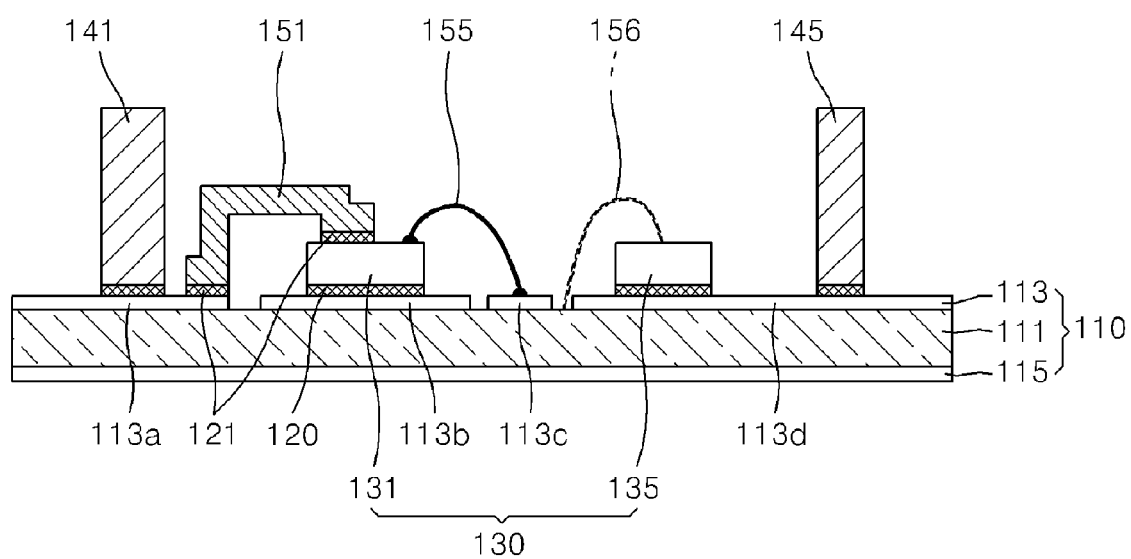

Referring to FIGS. 3, 4D, and 5D, a bonding process is performed in operation S360. First semiconductor chips 131 of the semiconductor chips 131 and 135 are clip-bonded to the conductive regions 113a on which the first electrodes 141 are disposed, using first interconnection lines 151 so that the first semiconductor chips 131 are electrically coupled to the first electrodes 141 by the first interconnection lines 151 through solders 121, respectively. Also, second semiconductor chips 135 of the semiconductor chips 131 and 135 and the second electrodes 145 are disposed on the same conductive regions 113d so that the second semiconductor chips 135 are electrically coupled to the second electrodes 145. Portions of the first semiconductor chips 131 may be electrically coupled to the conductive regions 113c other than the conductive regions 113b on which the part of the first semiconductor chips 131 are disposed, through first wires 155. Also, the second semiconductor chips 135 may be electrically coupled to conductive regions other than the conductive regions 113d on which the second semiconductor chips 135 are disposed, through second wires 156. Wires 155 and 156 may comprise wire bonds, ribbon bonds, and the like.

Figure 4E:
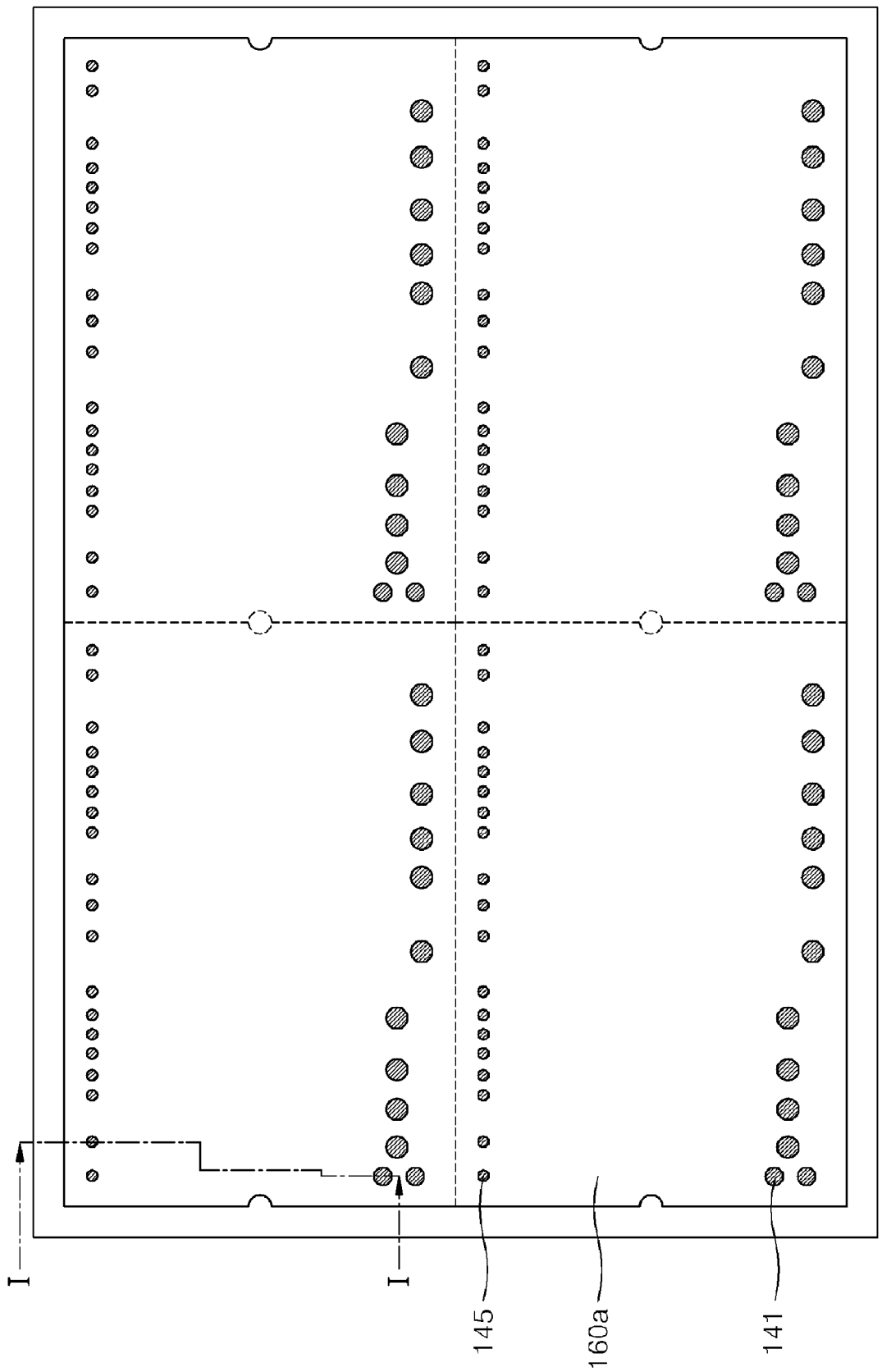
Figure 5E:
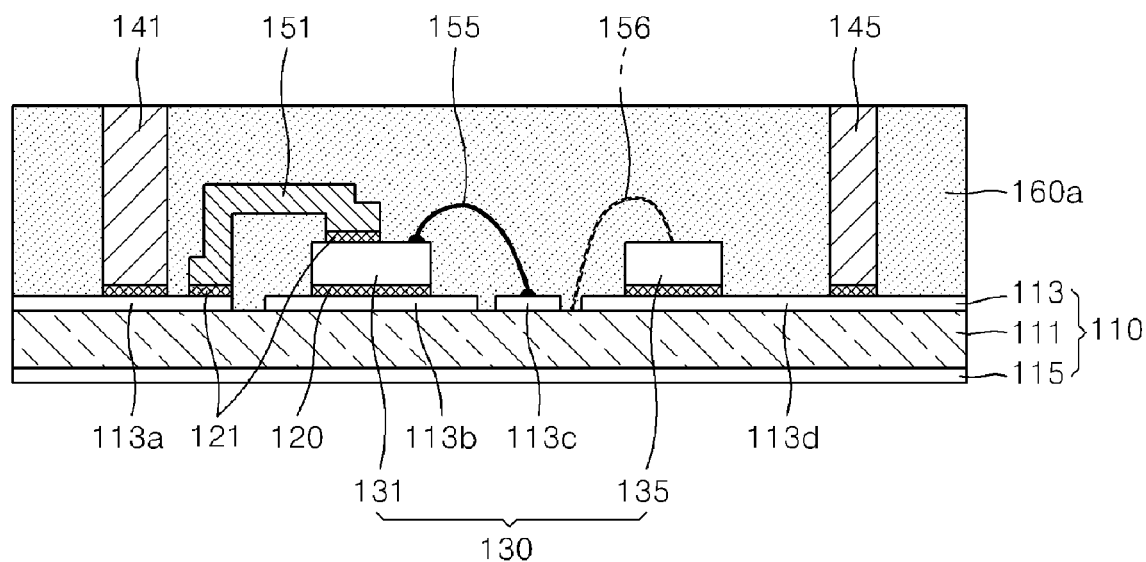

Referring to FIGS. 3, 4E, and 5E, an encapsulation unit 160a is formed on the mother substrate 100a in operation S370. A transfer molding process may be used to form the encapsulation unit 160a. The encapsulation unit 160a is formed to cover the first and second semiconductor chips 131 and 135, the first and second electrodes 141 and 145, the first interconnection line 151, and the first and second wires 155 and 156, and to expose at least top surfaces of the first and second electrodes 141 and 145. The encapsulation unit 160a may comprise EMC.

Figure 5F:
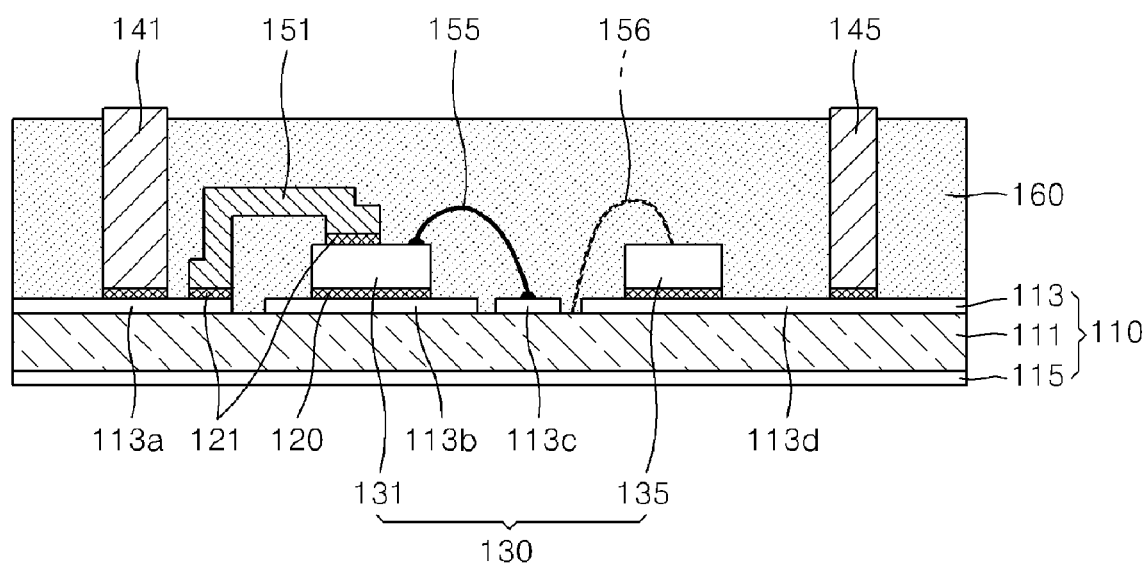

Referring to FIGS. 3, 4F, and 5F, the encapsulation unit 160a is etched to a predetermined or desired thickness, thereby forming an encapsulation unit 160 to expose top and side surfaces of the first and second electrodes 141 and 145 in operation S380. The etching may be done by a laser process, a chemical process, a polishing process, or other known etching process. Solder plated layers 171 and 175 may be further formed using a solder plating process on the exposed top and side surfaces of the first and second electrodes 141 and 145. In another embodiment, the solder plated layers 171 and 175 may be formed only on the exposed top surfaces of the first and second electrodes 141 and 145 without etching the encapsulation unit 160a as described with reference to FIGS. 4F and 5F. Thereafter, in operation S390, the mother substrate 100a is separated (e.g., sawed) into individual semiconductor power module packages 100 using a laser, a blade, or other known cutting tool, thereby completing fabrication of the semiconductor power module package 100.

Figure 4G:
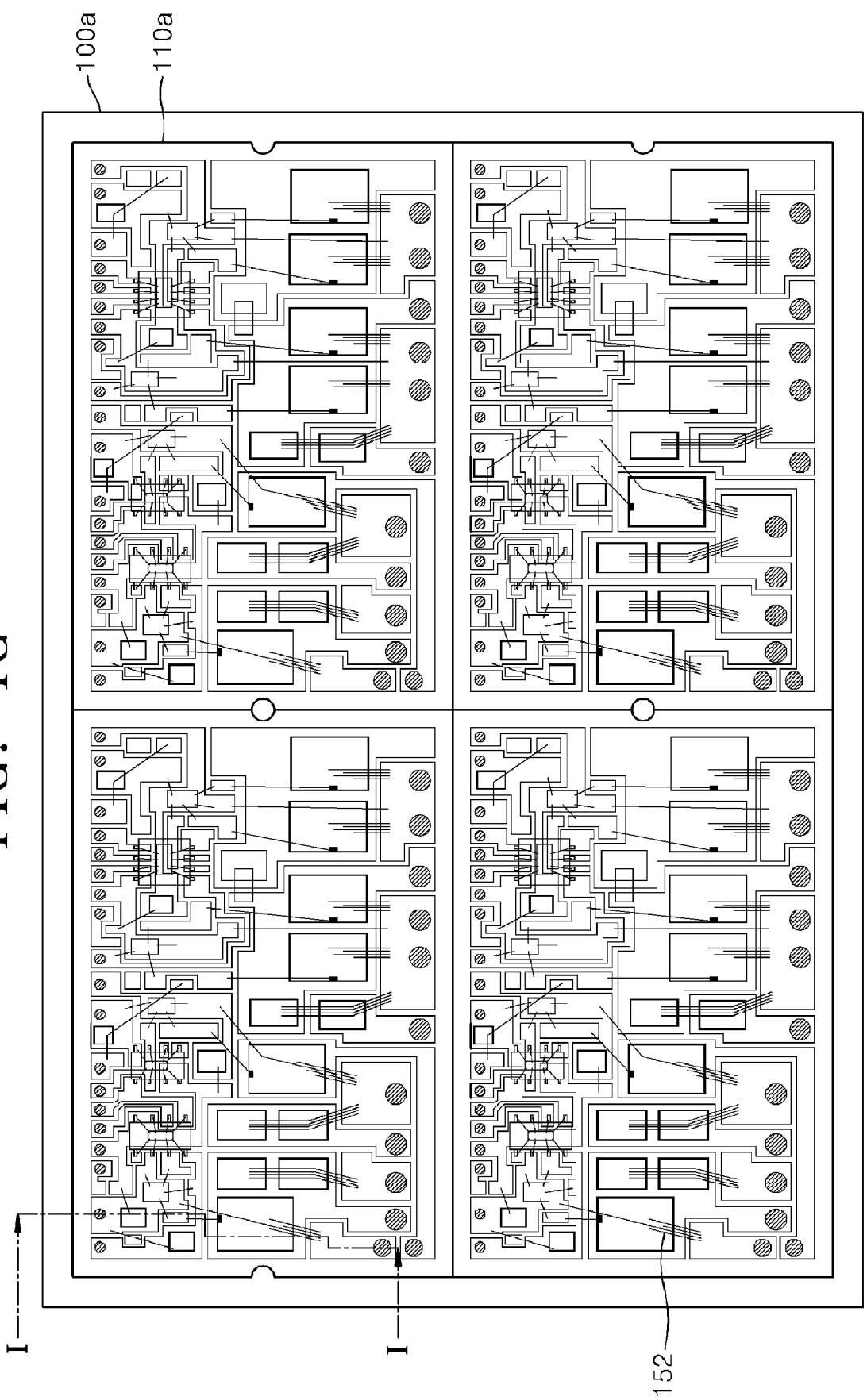
FIG. 4G is a plan view illustrating a method of fabricating a semiconductor power module package according to another embodiment of the present invention.
Figure 5G:
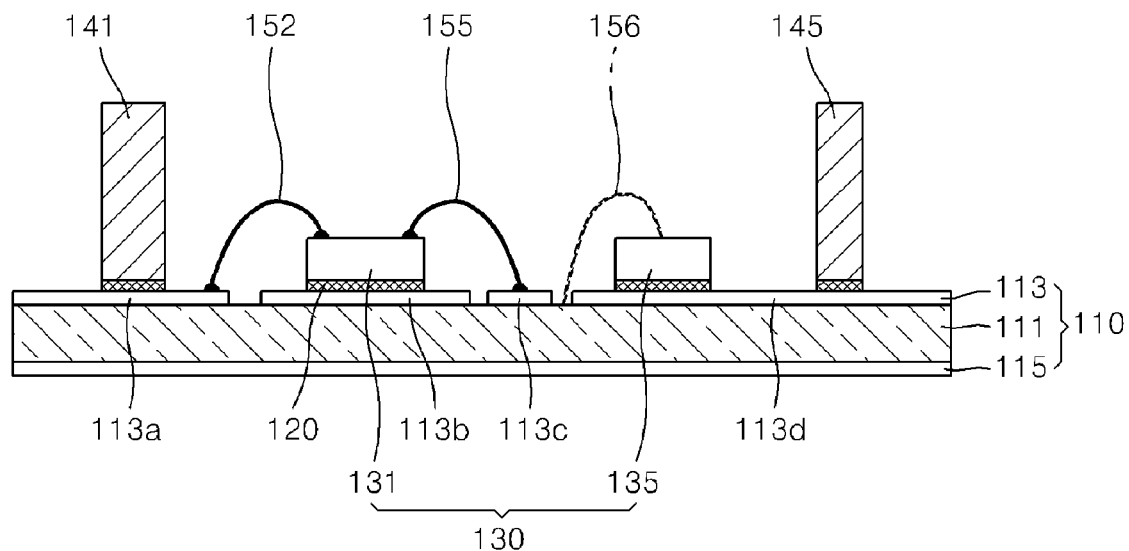
FIG. 5G is a cross-sectional view taken along a line I-I of FIG. 4G.

Meanwhile, referring to FIGS. 2A, 4G, and 5G, a wire bonding process may be performed instead of the clip bonding process described with reference to FIGS. 4D and 5D, so that the first semiconductor chips 131 may be electrically coupled to the first electrodes 141 through second interconnection lines 152. That is, the first semiconductor chips 131 are wire-bonded to the conductive regions 113a on which the first electrodes 141 are disposed, using the second interconnection lines 152 that are wires, thereby electrically coupling the first semiconductor chips 131 and the first electrodes 141. Second interconnect lines 152 may comprise wire bonds, ribbon bonds, and the like.

Figure 4H:
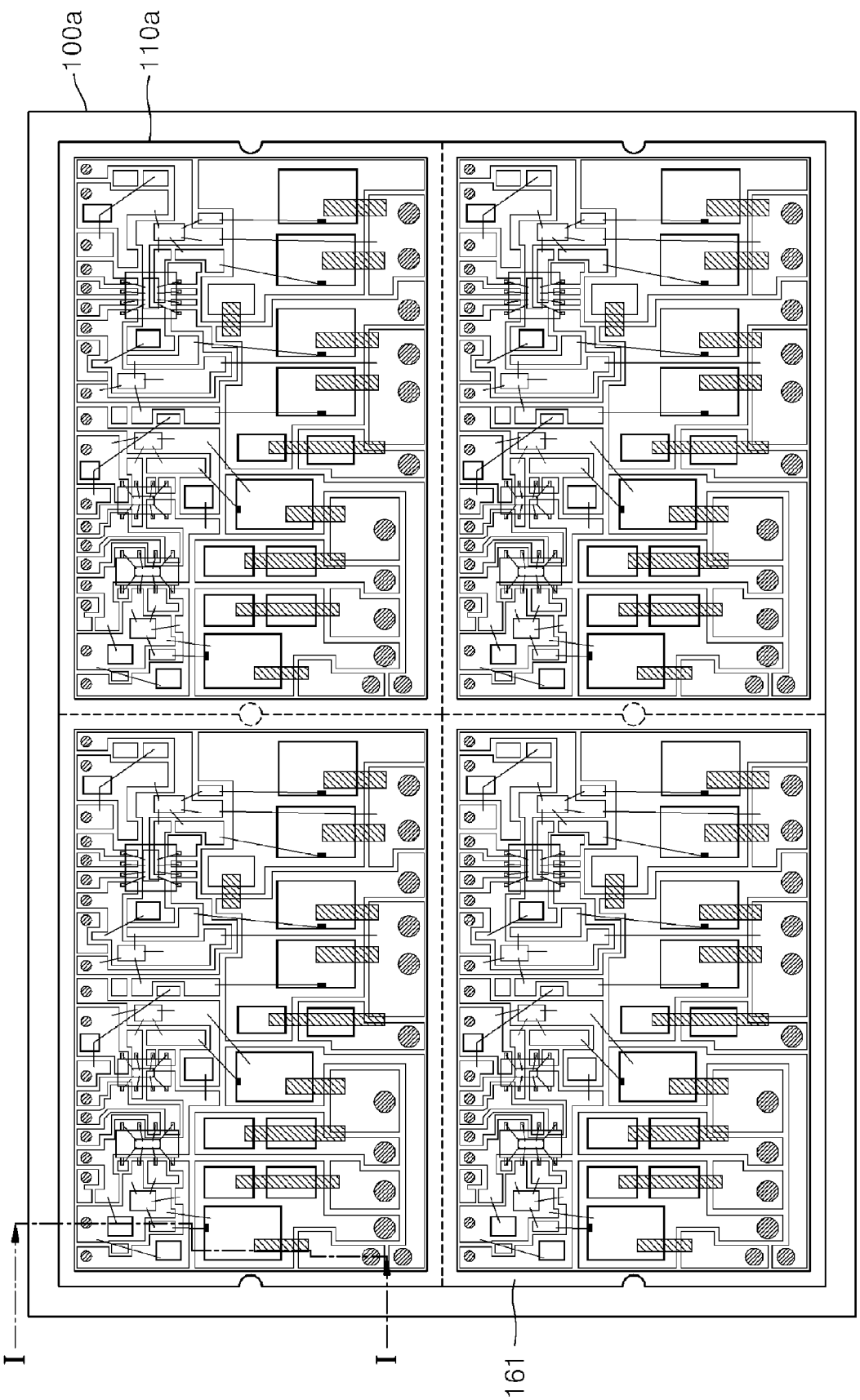
FIGS. 4H and 4I are plan views illustrating a method of fabricating a semiconductor power module package according to yet another embodiment of the present invention.
Figure 4I:
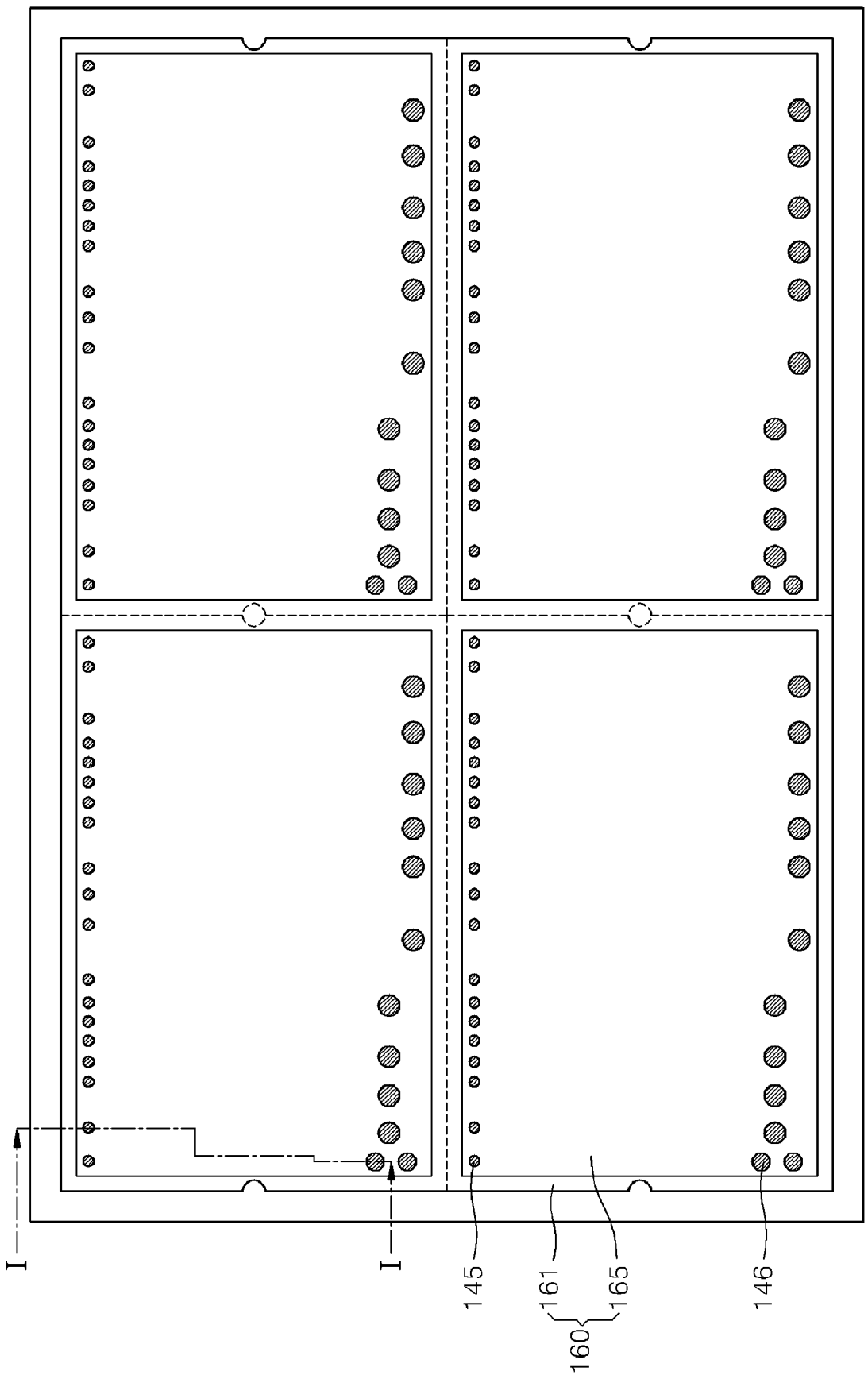
Figure 5H:
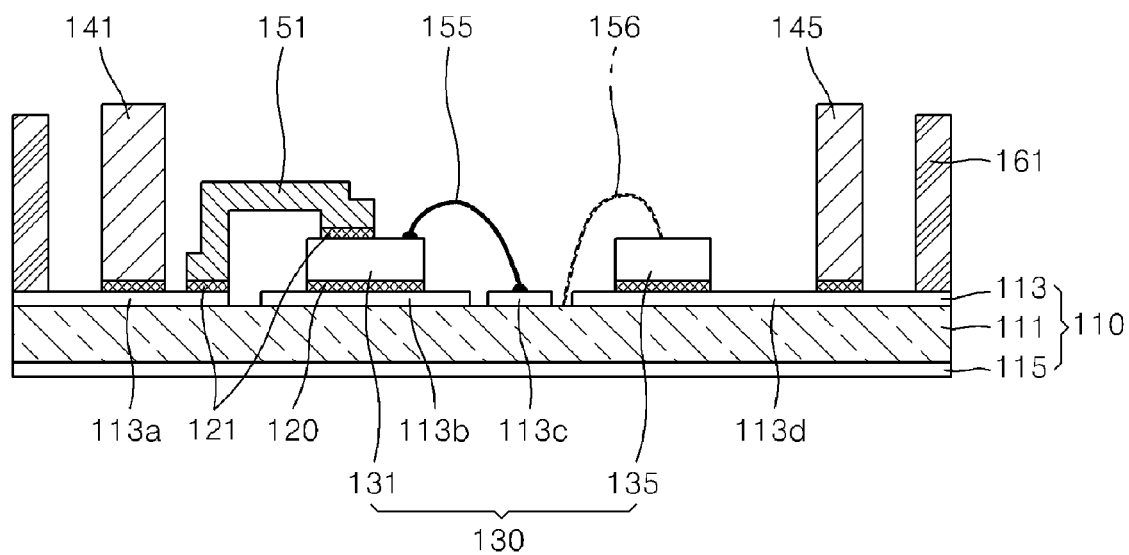
FIGS. 5H and 5I are cross-sectional views taken along lines I-I of FIGS. 4H and 4I, respectively.
Figure 5I:
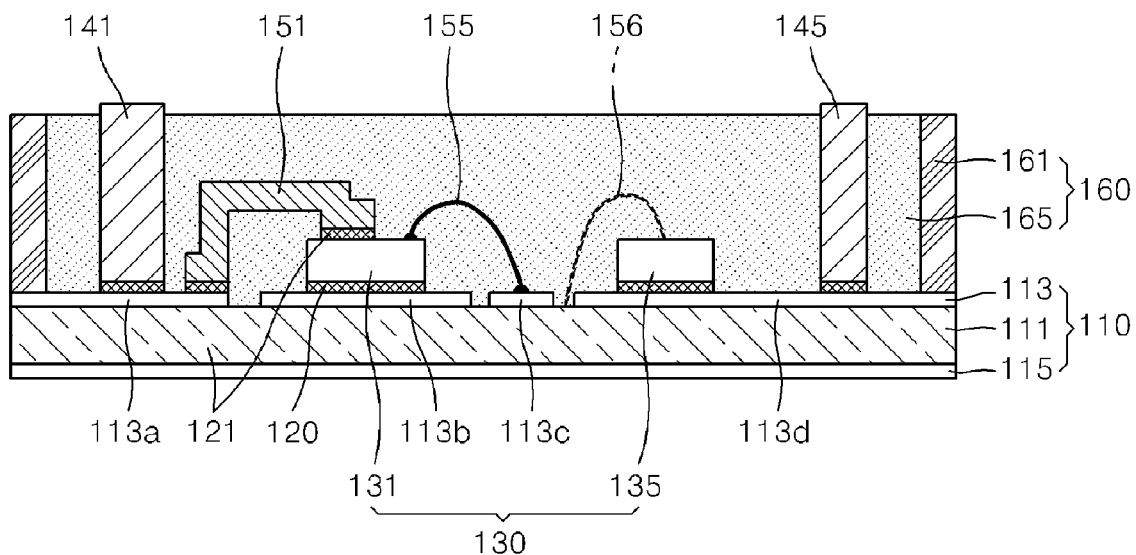

Also, a one-stage molding process described with reference to FIGS. 4E, 4F, 5E, and 5F may be replaced by a two-stage molding process. Specifically, referring to FIGS. 4H and 5H, a wall portion 161 of the encapsulation unit 160 may be formed along the periphery (e.g., the edges) of each of the unit substrates 110a using a transfer molding process. In this case, the wall portion 161 may be formed to a height lower than that of the first and second electrodes 141 and 145. Thereafter, referring to FIGS. 4I and 5I, a liquid epoxy material may be disposed in the area enclosed by each wall portion 161 and cured so that a main portion 165 is formed on each of the unit substrates 110a. When the molding process is performed in two stages as described above, the wall portion 161 may be formed to a height lower than that of the first and second electrodes 141 and 145 such that the encapsulation unit 160 is formed to expose the top and side surfaces of the first and second electrodes 141 and 145. Therefore, operation S380 in which the encapsulation unit 160a is etched as described with reference to FIGS. 4F and 5F may be omitted.

Figure 7:
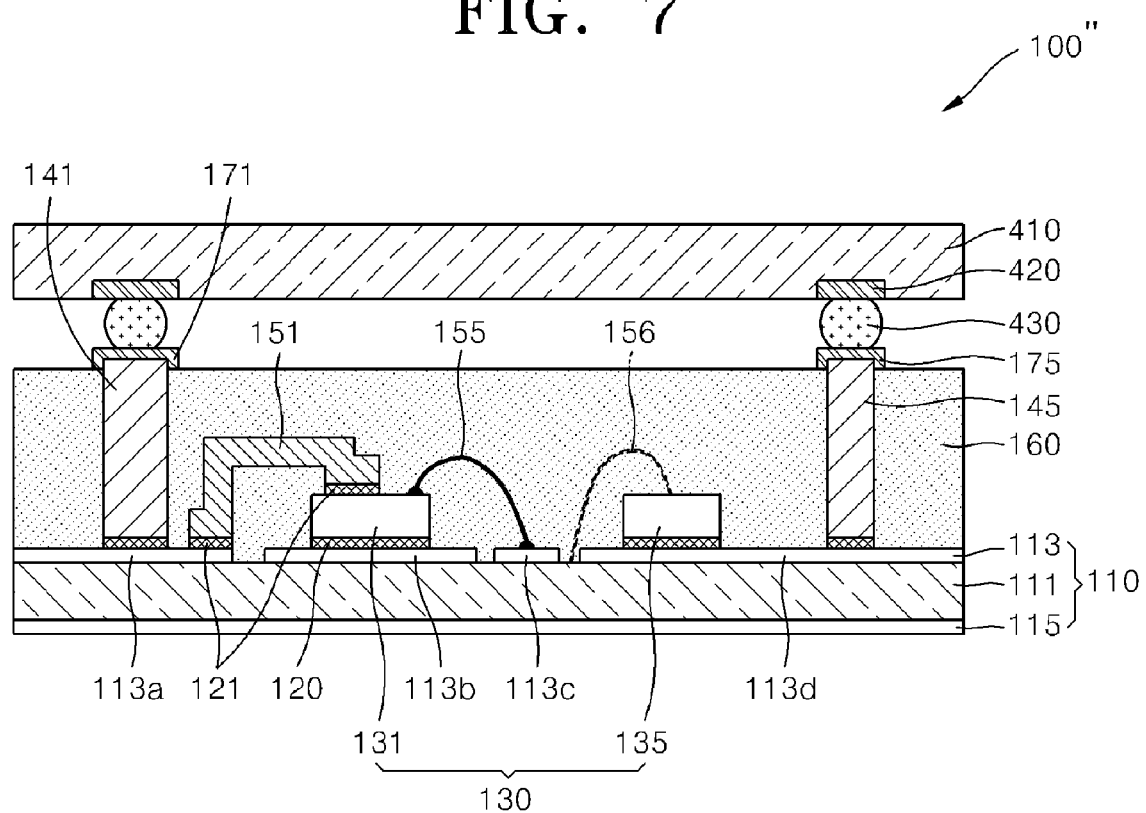
FIG. 7 is a cross-sectional view of a semiconductor power module package according to another embodiment of the present invention.

FIG. 7 is a cross-sectional view of a semiconductor power module package 100" according to another embodiment of the present invention.

Referring to FIG. 7, the semiconductor power module package 100" further includes an external control substrate 410 and external connection members 430. The external control substrate 410 may be a PCB. The external control substrate 410 includes connection pads 420 disposed on a surface thereof. First and second electrodes 141 and 145 are bonded to the connection pads 420 of the external control substrate 410 using the external connection members 430. Thus, the external control substrate 410 is electrically coupled to the first and second electrodes 141 and 145 through the external connection members 430. The external connection members 430 may comprise solder bodies.

Figure 8:
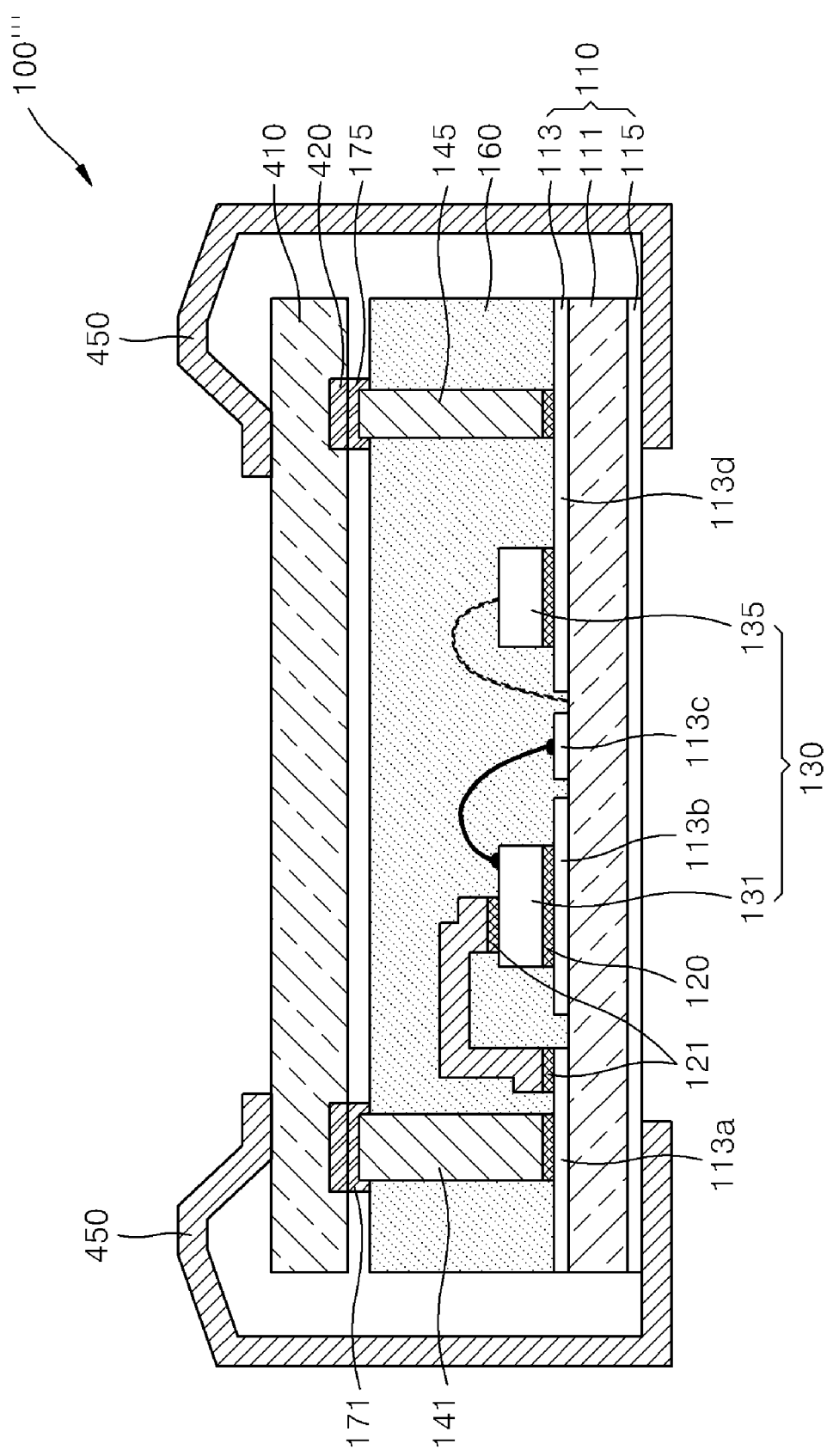
FIG. 8 is a cross-sectional view of a semiconductor power module package according to yet another embodiment of the present invention.

FIG. 8 is a cross-sectional view of a semiconductor power module package 100''' according to yet another embodiment of the present invention.

Referring to FIG. 8, the semiconductor power module package 100''' further includes an external control substrate 410 and fixing members 450. Connection pads 420 of the external control substrate 410 are electrically coupled by the first and second electrodes 141 and 145. In order to reinforce adhesion between the connection pads 420 and the first and second electrodes 141 and 145, the external control substrate 410 and a packaging substrate 110 are fixed using the fixing members 450. The fixing members 450 may comprise spring clips.

In another aspect of the present invention, one or more instances of package 100 may be attached and electrically coupled to an interconnect substrate to provide a system. Such a system may have a construction similar to the construction shown in FIG. 7, where the interconnect substrate is illustrated by external control substrate 410, and where an instance of package 100 is illustrated by the remaining components shown in the figure, except for connection members 430, which may be used to couple the package to the interconnect substrate.

According to various aspects of the present invention as described above, electrodes used for coupling semiconductor chips with terminals disposed outside the semiconductor chips are mounted on a substrate on which the semiconductor chips are disposed, and encapsulated. As a result, since a lead frame is not required, a semiconductor power module package can be structurally simplified and downscaled.

The packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A semiconductor power module package comprising:
    a substrate;
    a plurality of semiconductor chips disposed on a top surface of the substrate;
    a plurality of electrodes attached to the top surface of the substrate and electrically coupled to a plurality of conductive layer patterns;
    a plurality of interconnection lines that electrically couple parts of the semiconductor chips with parts of the conductive layer patterns; and
    an encapsulation unit covering the semiconductor chips, the electrodes, and the interconnection lines and exposing at least the top surfaces of the electrodes,
    wherein the semiconductor chips include at least one power semiconductor chip and at least one control semiconductor chip,
    wherein the substrate has the same structure under both the power semiconductor chip and the control semiconductor chip, and
    the semiconductor chips and the electrodes are electrically connected via the interconnection lines and the conductive layer patterns.

2. The package of claim 1, wherein at least one interconnection line comprises gold or aluminium.

3. The package of claim 1, wherein the interconnection lines comprise at least one wire.

4. The package of claim 1,
    wherein the electrodes include power electrodes and signal electrodes,
    and wherein the power electrodes have larger sizes than the signal electrodes.

5. The package of claim 4, wherein at least one power semiconductor chip is electrically coupled to one or more power electrodes, and at least one control semiconductor chip is electrically coupled to one or more signal electrodes.

6. The package of claim 5, wherein the substrate comprises: an insulating layer; and
    a plurality of conductive regions disposed on the insulating layer and electrically insulated from one another,
    wherein the at least one power semiconductor chip, the at least one control semiconductor chip, the power electrodes, and the signal electrodes are disposed on the conductive regions and bonded onto the conductive regions with solder material.

7. The package of claim 6, wherein the at least one power semiconductor chip is disposed on and electrically coupled to a first conductive region;
    wherein a first power electrode is disposed on and electrically coupled to a second conductive region, and
    wherein a first power semiconductor chip is electrically coupled to the first power electrode through a first interconnection line, the first interconnection line having a first portion electrically coupled to the first power semiconductor chip and a second portion electrically coupled to the second conductive region.

8. The package of claim 7, wherein the at least one control semiconductor chip and at least one signal electrode are disposed on the same conductive region so that the at least one control semiconductor chip is electrically coupled to the at least one signal electrode.

9. The package of claim 1, wherein at least one electrode comprises a plated layer of tin or plated layers of nickel and gold, and
    wherein the structure of at least one electrode comprises an I-shaped pillar structure or an inverted T-shaped structure.

10. The package of claim 1, further comprising a plated layer disposed on at least the exposed top surface of at least one electrode.

11. The package of claim 1, wherein the encapsulation unit comprises:
    a wall portion comprising a first material and being disposed along an edge of the substrate; and
    a main portion comprising a second material and being disposed adjacent to the wall portion and over at least a portion of the substrate, the main portion exposing at least the top surfaces of the electrodes.

12. The package of claim 1, further comprising:
    a second substrate including connection pads disposed on a surface thereof; and
    a plurality of connection members disposed on the connection pads of the second substrate and for bonding the electrodes to the connection pads to electrically couple the electrodes with the connection pads.

13. The package of claim 1, wherein the substrate is a first substrate and wherein the package further comprises:
    a second substrate including connection pads disposed on a surface thereof; and
    fixing members for fixing the second substrate and the first substrate,
    wherein the connection pads of the second substrate are directly and electrically contacted to the electrodes that are attached to the first substrate.

14. The package of claim 13, wherein the second substrate comprises a printed circuit board, and the fixing members comprise spring clips.

15. A system comprising an interconnect substrate and the package of claim 1 attached to the interconnect substrate.

16. The package of claim 1, wherein the least one control semiconductor chip comprises at least one logic gate.

17. A method of fabricating a semiconductor power module package, the method comprising:
    mounting a plurality of semiconductor chips and a plurality of electrodes on each of a plurality of unit substrates at the top surfaces thereof, wherein the unit substrates are part of a mother substrate and each unit substrate comprises a plurality of conductive layer patterns, wherein the semiconductor chips include at least one power semiconductor chip and at least one control semiconductor chip mounted on each unit substrate, wherein the plurality of electrodes are mounted on each unit substrate such that they are electrically coupled to the plurality of conductive layer patterns of said unit substrate, and wherein each unit substrate has the same structure under both the power semiconductor chip and the control semiconductor chip;

performing a bonding process using a plurality of interconnection lines to electrically interconnect the semiconductor chips and the electrodes that are mounted on each unit substrate, the bonding process resulting in the interconnection lines of each unit substrate coupling parts of the semiconductor chips with parts of the conductive layer patterns that are disposed on said each unit substrate such that the semiconductor chips and the electrodes are electrically connected via the interconnection lines and the conductive layer patterns;

forming an encapsulation unit on the substrate to cover the semiconductor chips, interconnection lines, and the electrodes and to expose at least the top surfaces of the electrodes; and separating the mother substrate into individual semiconductor power module packages.

18. The method of claim 17, wherein mounting the plurality of semiconductor chips and the plurality of electrodes on each of a plurality of unit substrates comprises performing a reflow process to electrically couple the semiconductor chips and the electrodes to conductive regions disposed on the unit substrates.

19. The method of claim 18, after the performing of the reflow process, further comprising removing remnants using a cleaning process.

20. The method of claim 17, wherein the substrate comprises an insulating layer and a plurality of conductive regions disposed on the insulating layer, wherein the semiconductor chips include power semiconductor chips and control semiconductor chips, and the electrodes comprise power electrodes and signal electrodes, and wherein at least one power semiconductor chip is electrically coupled to at least one conductive region on which a power electrode is disposed by a clip-bonded interconnect wire or by a bonded wire.

21. The method of claim 17, after the forming of the encapsulation unit, further comprising partially removing the encapsulation unit to expose the at least top surfaces and side surfaces of the electrodes.

22. The method of claim 17, wherein the forming of the encapsulation unit comprises:

forming a wall portion along an edge of each of the unit substrates using a primary molding process to have a lower height than the electrodes; and forming a main portion on the substrate in an area adjacent to the wall portion using a secondary molding process to cover the semiconductor chips and the electrodes and expose the at least top surfaces of the electrodes.

23. A semiconductor power module package comprising:
a substrate;
a plurality of semiconductor chips disposed on a top surface of the substrate;
a plurality of electrodes attached to the top surface of the substrate and electrically coupled to a plurality of conductive layer patterns;
a plurality of interconnection lines that electrically couple parts of the semiconductor chips with parts of the conductive layer patterns;
an encapsulation unit covering the semiconductor chips, the electrodes, and the interconnection lines and exposing at least the top surfaces of the electrodes; and
wherein at least one of the semiconductor chips comprises a power transistor and at least one of the semiconductor chips comprises at least one logic gate,
wherein the substrate has the same structure under all the semiconductor chips, and
the semiconductor chips and the electrodes are electrically connected via the interconnection lines and the conductive layer patterns.

24. The package of claim 23, wherein the substrate comprises a ceramic insulating layer under all the semiconductor chips.

25. The package of claim 24, wherein the substrate further comprises a lower conductive layer under all the semiconductor chips, the lower conductive layer being disposed on bottom surface of the ceramic insulating layer.

26. A semiconductor power module package comprising:
a substrate having a top surface and a plurality of conductive regions disposed at the top surface;
a plurality of semiconductor chips disposed on the top surface of the substrate;
a plurality of electrodes attached to the top surface of the substrate and electrically coupled to the semiconductor chips, each electrode being disposed on a conductive region and bonded thereto with solder material;
a plurality of interconnection lines that electrically couple parts of the semiconductor chips with parts of the electrodes; and
an encapsulation unit covering the semiconductor chips, the electrodes, and the interconnection lines and exposing at least the top surfaces of the electrodes,
wherein the semiconductor chips include at least one power semiconductor chip and at least one control semiconductor chip, and
wherein the substrate has the same structure under both the power semiconductor chip and the control semiconductor chip.

27. The package of claim 26, wherein the top surface of at least one electrode has width in a dimension parallel to the top surface of the substrate; wherein the encapsulation unit covers a side surface of said at least one electrode except for a portion that is within a first distance of the electrode's top surface, and wherein the first distance is less than the width of said at least one electrode.

* * * * *